United States Patent
Schaefer et al.

(10) Patent No.: US 11,126,498 B2
(45) Date of Patent: Sep. 21, 2021

(54) MEMORY DEVICE WITH CONFIGURABLE ERROR CORRECTION MODES

(71) Applicant: Micron Technology, Inc., Boise, ID (US)

(72) Inventors: Scott E. Schaefer, Boise, ID (US); Aaron P. Boehm, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/792,820

(22) Filed: Feb. 17, 2020

(65) Prior Publication Data

US 2020/0264950 A1     Aug. 20, 2020

Related U.S. Application Data

(60) Provisional application No. 62/807,520, filed on Feb. 19, 2019.

(51) Int. Cl.
| | |
|---|---|
| *H03M 13/00* | (2006.01) |
| *G06F 11/10* | (2006.01) |
| *G11C 29/44* | (2006.01) |
| *G11C 7/10* | (2006.01) |
| *G11C 29/42* | (2006.01) |
| *G06F 11/07* | (2006.01) |

(52) U.S. Cl.
CPC ...... *G06F 11/1048* (2013.01); *G06F 11/0787* (2013.01); *G06F 11/1068* (2013.01); *G11C 7/1045* (2013.01); *G11C 29/42* (2013.01); *G11C 29/44* (2013.01)

(58) Field of Classification Search
CPC ............. G06F 11/1048; G06F 11/1068; G06F 11/0787; G11C 29/44; G11C 29/42; G11C 7/1045
See application file for complete search history.

(56) References Cited

U.S. PATENT DOCUMENTS

| | | | | |
|---|---|---|---|---|
| 5,917,838 A | * | 6/1999 | Wardrop | G06F 11/1044 |
| | | | | 714/746 |
| 6,584,543 B2 | | 6/2003 | Williams et al. | |

(Continued)

OTHER PUBLICATIONS

ISA/KR, International Search Report and Written Opinion of the International Searching Authority, Int'l Appl. No. PCT/US2020/018672, dated Feb. 18, 2020, Korean Intellectual Property Office, Seo-gu, Daejeon, Republic of Korea, 13 pgs.

*Primary Examiner* — Samir W Rizk
(74) *Attorney, Agent, or Firm* — Holland & Hart LLP

(57) ABSTRACT

Methods, systems, and apparatus to selectively implement single-error correcting (SEC) operations or single-error correcting and double-error detecting (SECDED) operations, without noticeably impacting die size, for information received from a host device. For example, a host device may indicate that a memory system is to implement SECDED operations using one or more communications (e.g., messages). In another example, the memory system may be hardwired to perform SECDED for certain options. The memory system may adapt circuitry associated with SEC operations to implement SECDED operations without noticeably impacting die size. To implement SECDED operations using SEC circuitry, the memory system may include some additional circuitry to repurpose the SEC circuitry for SECDED operations.

24 Claims, 12 Drawing Sheets

(56) References Cited

U.S. PATENT DOCUMENTS

| | | |
|---|---|---|
| 7,747,933 B2 | 6/2010 | Johnson |
| 2009/0319864 A1 | 12/2009 | Shrader |
| 2018/0053545 A1* | 2/2018 | Son ......................... G11C 7/08 |
| 2018/0300200 A1 | 10/2018 | Kwak et al. |
| 2019/0012229 A1 | 1/2019 | Cha et al. |

* cited by examiner

MEMORY DEVICE WITH CONFIGURABLE ERROR CORRECTION MODES

CROSS REFERENCE

The present Application for Patent claims the benefit of U.S. Provisional Patent Application No. 62/807,520, by SCHAEFER et al., entitled "MEMORY DEVICE WITH CONFIGURABLE ERROR CORRECTION MODES," filed Feb. 19, 2019, assigned to the assignee hereof, and expressly incorporated by reference herein.

BACKGROUND

The following relates generally to a memory system, and more specifically to memory device with configurable internal error correction modes.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source.

In some cases, a memory device (e.g., a DRAM device) may receive commands or data from an external device (e.g., a host device). In some cases, errors may be introduced into data that is being stored internally in a memory device.

DETAILED DESCRIPTION

Figure 1:
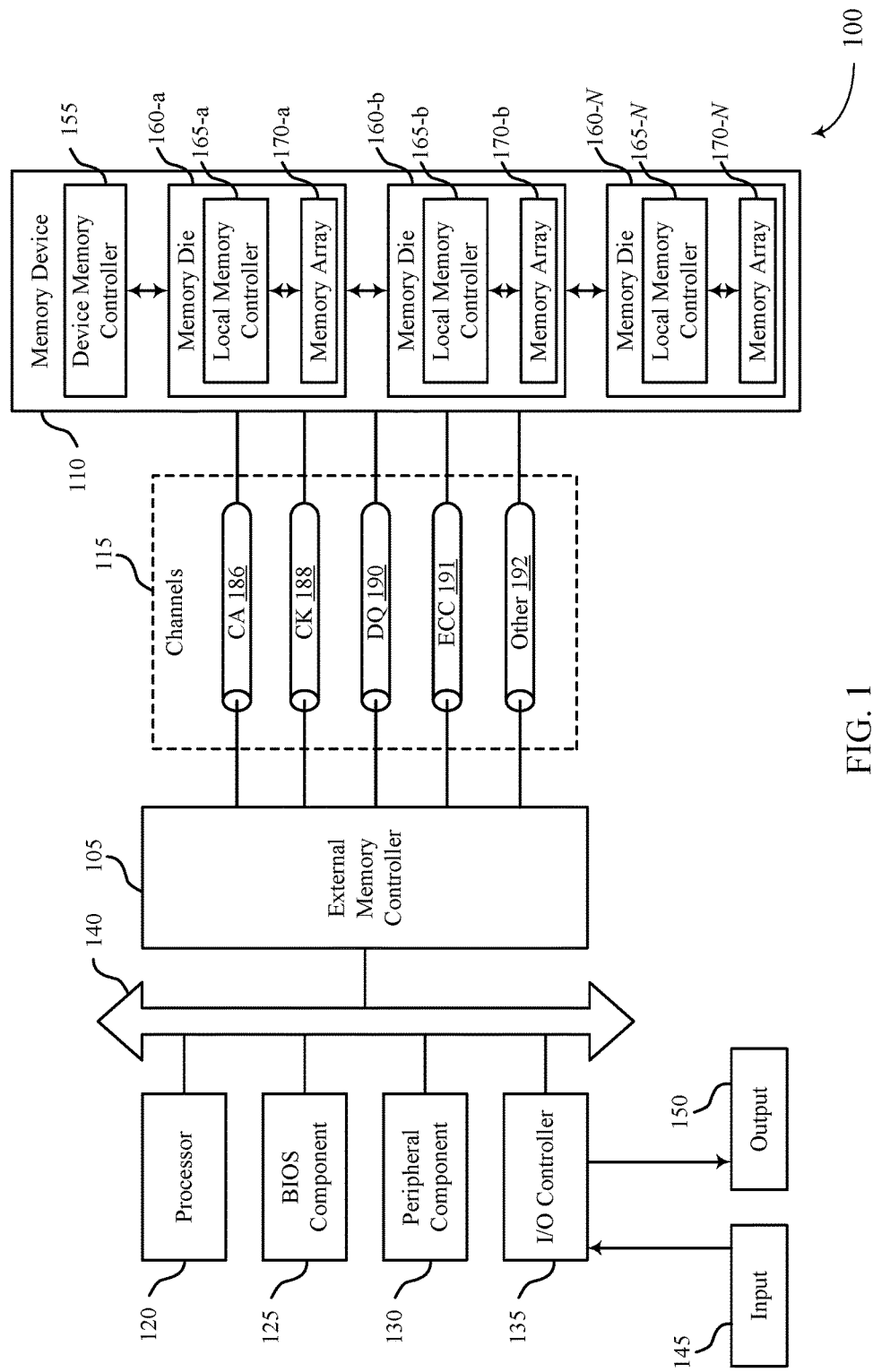
FIG. 1 illustrates an example of a system that that supports that supports configurable error correction modes as disclosed herein.

Memory devices may operate under various conditions as part of electronic apparatuses such as personal computers, wireless communication devices, servers, internet-of-things (IoT) devices, electronic components of automotive vehicles, and the like. In some cases, memory devices supporting applications for certain implementations (e.g., automotive vehicles, in some cases with autonomous or semi-autonomous driving capabilities) may be subject to increased reliability constraints. As such, memory devices (e.g., DRAM) for some applications (e.g., automotive applications) may be expected to operate with a reliability that is based on relatively higher industry specifications (e.g., higher reliability constraints).

Data stored by a memory device may, in some cases, become corrupted. Corruption of data may refer to an unintentional change of the data and thus may refer to an unintended change in the data that is stored by one or more memory cells (e.g., from a logic one (1) to a logic zero (0), or vice versa). A deviation in the value of a bit from its original and intended value may be referred as an error, a bit error, or a data error. Some memory devices may be configured to internally detect and in at least some cases correct (repair) such data corruption or errors and thereby recover the data as intended before corruption. For example, as part of a write operation, a memory device may generate one or more error detection codewords and store those codewords in an array of memory cells with the data received from a host device. Upon performing a read operation to retrieve the data, the memory device may also retrieve the error detection codewords and perform error detection or error correction operations to fix any errors in the data that may have been introduced by the memory device. Such error detection and correction may rely upon error detection information including one or more error-correcting codes (ECCs) (e.g., Hamming codes). An error detection operation may be any operation that detects or corrects errors in a set of data and related processes, procedures, and techniques may be referred to as error detection/correction operation, a single error correction (SEC) operation, a single error correction double error detection (SECDED) operation, ECC processes, ECC procedures, ECC techniques, or in some cases as simply ECC. Error detection information or error detection codewords may be any type of information or codeword generated based on data to detect or correct errors in that that data and may be referred to as syndrome, ECC syndrome, ECC information, ECC, ECC codewords, error detection/correction information, error detection/correction codewords, SEC codeword, SEC information, SECDED codeword, SECDED information, or any combination thereof. ECC conducted internally within a memory device may generally be referred to as on-die ECC (whether within a single-die memory device or a multi-die memory device.

The host device may transmit data over data channels as part of a write operation to store data in an array of memory cells. Upon receiving the data, the memory device may perform an error detection operation. As part of the error detection operation, the memory device may generate a codeword, such as an ECC codeword, based on the data as received from the host device and store the data and the codeword in an array of memory cells. During a read operation, the memory device may also retrieve the codeword and perform error detection or error correction operations to fix any errors in the data that may have been introduced while in the memory device. As part of these procedures, the memory device may generate a new codeword (e.g., a second ECC codeword) based on the data retrieved from the array of memory cells using a same error-correcting code as was used to generate the first codeword. If the first and second codewords match, the memory device may determine that the data is not corrupt (e.g., no errors exist). If the first and second codewords do not match, the error detection operation may determine that the data is corrupt (e.g., at least one error exists). Depending on the strength of the error-correcting code, the error detection operation may be able to correct or detect some quantity of bit errors.

An SEC procedure may detect the occurrence of a single bit error (one bit in the data is corrupted) and correct the single bit error (determine the original, uncorrupted value of the data and perform one or more subsequent operations based on the original value of the data). In some cases, however, (e.g., in the event of two or more bit errors) an SEC procedure may increase a quantity of bit errors within the data by accidentally changing an uncorrupted bit. An SECDED procedure may detect the occurrence of both single bit errors and double-bit errors as well as correct the detected single bit errors. That is, the SECDED procedure may provide increased error detection (e.g., in the event of a double-bit error) which may correspond to an increased reliability for the memory device.

The memory system described herein may be configurable to selectively implement SEC operations or SECDED operations without noticeably impacting die size (e.g., as indicated by a host device if the memory system may optionally implement SEC operations or SECDED operations). For example, if optional, the host device may indicate for the memory system to implement SECDED. Here, the memory system may adapt some SEC circuitry to implement SECDED. Additionally, or alternatively, the host device may indicate for the memory system to implement SEC. The DRAM may be designed to support SEC ECC and then, by a metal mask or some other persistent method, hard code SECDED ECC without noticeable impacting die size. To implement SECDED using SEC circuitry, the memory system may include some additional circuitry to repurpose the SEC circuitry for SECDED without noticeably impacting die size. In some cases, the granularity of the data associated with an error detection codeword may be adjusted based on using SEC operations or SECDED operations. For example, the memory system may perform an error detection operation on two 128-bit data arrays using an 8-bit ECC codeword for SEC but may adapt the error detection operation to perform SECDED on a 256-bit data array using a 10-bit ECC codeword. This may enable the memory system to utilize the circuitry (e.g., data pins portions of the memory array for storing ECC information) for SEC in order to execute SECDED procedure without noticeably impacting die size. For example, the memory system my store ECC information generated by a SECDED procedure in a portion of the memory array for storing ECC information generated by an SEC procedure.

Features of the disclosure are further described below in the context of memory systems and a memory device with reference to FIGS. 1-3. Features of the disclosure are then described in the context of a burst of information and process flow with reference to FIGS. 4 and 5. These and other features of the disclosure are further illustrated by and described with reference to apparatus diagrams and flowcharts in FIGS. 6-9 that relate to configurable error correction modes.

FIG. 1 illustrates an example of a system 100 that utilizes one or more memory devices in accordance with aspects disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device. In some examples, system 100 is a graphics card.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose GPU (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or specialized graphics ports. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any quantity of memory dice 160-N). In a 3D memory device, a plurality of memory dice 160-N may be stacked on top of one another or next to one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel.

In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be ×4 (e.g., including four signal paths), ×8 (e.g., including eight signal paths), ×16 (including sixteen signal paths), and so forth. Signals communicated over the channels may use double data rate (DDR) signaling. For example, some symbols of a signal may be registered on a rising edge of a clock signal and other symbols of the signal may be registered on a falling edge of the clock signal. Signals communicated over channels may use single data rate (SDR) signaling. For example, one symbol of the signal may be registered for each clock cycle.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include any quantity of signal paths to decode address and command data (e.g., eight or nine signal paths).

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110. The data channels 190 may communicate signals that may be modulated using a variety of different modulation schemes (e.g., NRZ, PAM4).

In some cases, error detection information associated with data of an access operation may be communicated using one or more of the channels 115. The techniques described herein using error detection logic configured to selectively perform SEC operations or SECDED operations may be modified to detect or correct errors introduced into data as it is transmitted from a host device to the memory device 110. The error detection information may include codewords for detecting or correcting errors in the associated data. The codewords may be an SEC codeword or an SECDED codeword depending on a type of ECC being implemented by the system 100. The error detection information may be communicated over one or more ECC channels 191. The data may be communicated over a DQ channel 190 and the error detection information may be communicated during the same burst period. Additionally or alternatively, error detection information may be communicated over the DQ channels 190. Such error detection information may be referred to as in-line or rank error detection information. When using in-line or rank error detection, the external memory controller 105 and/or the memory device 110 may adjust the burst length of a burst of data to include both the data associated with the access operation and the error detection information associated with the data.

In some cases, the channels 115 may include one or more other channels 192 that may be dedicated to other purposes. These other channels 192 may include any quantity of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like). In other cases, a channel 192 may contain link ECC (e.g., SEC ECC, SECDED ECC, or other ECC) to provide ECC protection on data transmissions to and from the external memory controller 105 and the memory device 110.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes.

In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM4, PAM8, etc., quadrature amplitude modulation (QAM), quadrature phase shift keying (QPSK), and/or others. A multi-symbol signal or a PAM4 signal may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

The memory device 110 may be configured to selectively perform SEC operations or SECDED operations on data received from a host device as part of a write operation. Upon receiving the data, the memory device 110 may determine or generate one or more error detection codewords (e.g., ECC codewords) associated with the received data. The memory device 110 may then store the data and the one or more error detection codewords in one or more memory arrays 170. Upon retrieving the data from the one or more memory arrays 170 as part of a read operation, the memory device 110 may also retrieve the one or more error detection codewords from the one or more memory arrays 170. The memory device 110 may generate additional error detection codewords based on the data retrieved from the one or more memory arrays 170. The memory device 110 may compare the error detection codewords retrieved from the one or more memory arrays 170 to the additional error detection codewords generated or determined based on the data retrieved from the one or more memory arrays 170. The memory device 110 may detect one or more errors in the data retrieved from the one or more memory arrays 170, correct one or more errors in the data retrieved from the one or more memory arrays 170, or both based on the comparison of the codewords. The memory device 110 may transmit the retrieved data to the host device after performing the error detection operations as part of the read operation. The error detection operations described herein may be performed by an external memory controller 105, a device memory controller 155, or a local memory controller 165, or a combination thereof.

Figure 2:
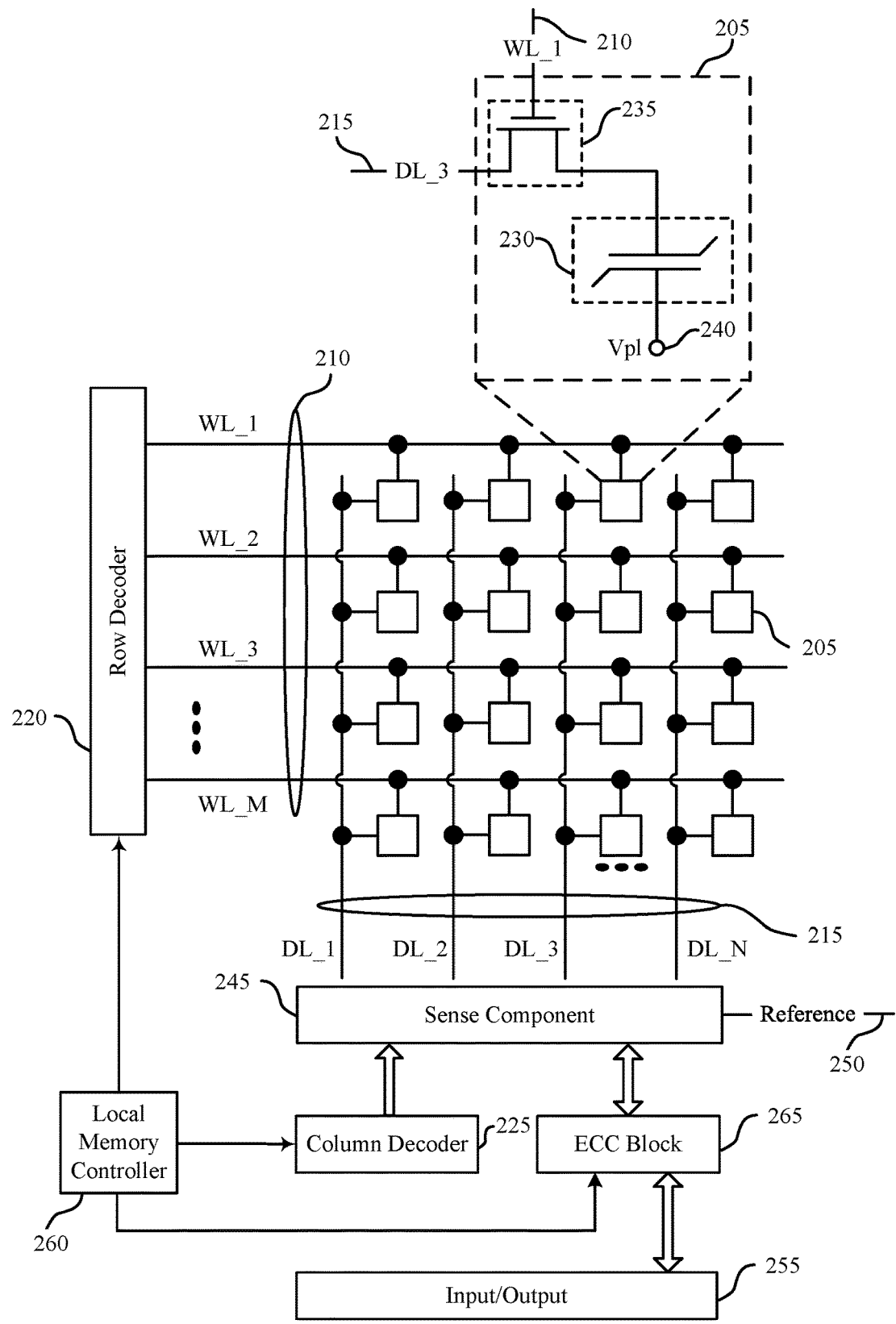
FIG. 2 illustrates an example of a memory die that supports configurable error correction modes as disclosed herein.

FIG. 2 illustrates an example of a memory die 200 in accordance with various examples of the present disclosure. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed.

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory die 200 may include the access lines (e.g., the word lines 210 and the digit lines 215) arranged in a grid-like pattern. Memory cells 205 may be positioned at intersections of the word lines 210 and the digit lines 215. By biasing a word line 210 and a digit line 215 (e.g., applying a voltage to the word line 210 or the digit line 215), a single memory cell 205 may be accessed at their intersection.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. For example, the memory die 200 may include multiple word lines 210, labeled WL_1 through WL_M, and multiple digit lines 215, labeled DL_1 through DL_N, where M and N depend on the size of the memory array. Thus, by activating a word line 210 and a digit line 215, e.g., WL_1 and DL_3, the memory cell 205 at their intersection may be accessed. The intersection of a word line 210 and a digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 may be the cell plate reference voltage, such as Vpl, or may be ground, such as Vss. In some cases, the voltage source 240 may be an example of a plate line coupled with a plate line driver. The switching component 235 may be an example of a transistor or any other type of switch device that selectively establishes or de-establishes electronic communication between two components.

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 is a transistor and its operation may be controlled by applying a voltage to the transistor gate, where the voltage differential between the transistor gate and transistor source may be greater or less than a threshold voltage of the transistor. In some cases, the switching component 235 may be a p-type transistor or an n-type transistor. The word line 210 may be in electronic communication with the gate of the switching component 235 and may activate/deactivate the switching component 235 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication (e.g., constant) with the digit line 215.

The sense component 245 may be configured to detect a state (e.g., a charge) stored on the capacitor 230 of the memory cell 205 and determine a logic state of the memory cell 205 based on the stored state. The charge stored by a memory cell 205 may be extremely small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge. During a read operation, the capacitor 230 of memory cell 205 may output a signal (e.g., discharge a charge) to its corresponding digit line 215. The signal may cause a voltage of the digit line 215 to change. The sense component 245 may be configured to compare the signal received from the memory cell 205 across the digit line 215 to a reference signal 250 (e.g., reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0. The sense component 245 may include various transistors or amplifiers to detect and amplify a difference in the signals. The detected logic state of memory cell 205 may be output through ECC block 265 as output 255. In some cases, the sense component 245 may be part of another component (e.g., an ECC Block 265, a column decoder 225, row decoder 220). In some cases, the sense component 245 may be in electronic communication with the row decoder 220 or the column decoder 225.

The local memory controller 260 may control the operation of memory cells 205 through the various components (e.g., row decoder 220, column decoder 225, sense component 245, ECC Block 265). The local memory controller 260 may be an example of the local memory controller 165 described with reference to FIG. 1. In some cases, one or more of the row decoder 220, column decoder 225, sense component 245, and ECC block 265 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 260 may generate row and column address signals to activate the target word line 210 and the target digit line 215. The local memory controller 260 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 260 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a specific signal (e.g., voltage) to the digit line 215 during the write operation to store a specific state (e.g., charge) in the capacitor 230 of the memory cell 205, the specific state (e.g., charge) may be indicative of a desired logic state.

The ECC block 265 or the local memory controller 260 may perform one or more error detection operations on data received from the host device as part of a write operation. For example, the ECC block 265 may determine or generate one or more error detection codewords associated with the data received from the host device as part of a write operation. In some cases, the ECC block 265 may include error detection logic or may cause error detection logic (not shown) to perform the error detection operations described herein. The ECC block 265 may cause the data and the one or more error detection codewords to be stored in one or more memory cells 205 as part of the write operation.

In some cases, a host device may transmit data to be stored in the memory die over a first channel and error detection information over a second channel as part of the write operation. The error detection information may comprise one or more SEC codewords or a SECDED codeword depending on a mode of ECC operation of the memory die 200. The memory die 200 may utilize the error detection information to detect and correct single-bit and, in some cases, detect and/or correct double-bit errors. In some cases, the memory die 200 may store an indication of detected single-bit or double-bit errors. By correcting single-bit errors and/or storing an indication of detected double-bit errors, the memory die 200 may increase the reliability of the stored data.

Table 1, shown below, shows the likely quantity of errors (e.g., the quantity of bits with an incorrect error) after employing each type of error detection operation. In particular, a SECDED operation may prevent additional errors being introduced into the data in the event of a double-bit error while an SEC operation may increase the quantity of errors from a double-bit error to a three-bit error.

TABLE 1

| Errors After Error Detection Operation | | | | | |
|---|---|---|---|---|---|
| Errors Before Error Detection Operation | 1 | 2 | 3 | 4 | 5 |
| Errors After SEC Operation | 0 | 3 | 3/4 | 4/5 | 5/6 |
| Errors After SECDED Operation | 0 | 2 | 3/4 | 4/5 | 5/6 |

In some cases, the local memory controller 260 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The target memory cell 205 may transfer a signal to the sense component 245 in response to biasing the access lines. The sense component 245 may amplify the signal. The local memory controller 260 may fire the sense component 245 (e.g., latch the sense component) and thereby compare the signal received from the memory cell 205 to the reference signal 250. Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation.

As part of the read operation, the local memory controller 260 or the ECC block 265 may be configured to perform one or more error detection operations on the data retrieved from the one or more memory cells 205. Upon retrieving the data from the one or more memory cells 205 as part of the read operation, the ECC block 265 may also retrieve the one or more error detection codewords from the one or more memory cells 205. The ECC block 265 may generate additional error detection codewords based on the data retrieved from the one or more memory cells 205. The ECC block 265 may compare the error detection codewords retrieved from the one or more memory cells 205 to the additional error detection codewords generated or determined based on the data retrieved from the one or more memory cells 205. The ECC block 265 may detect one or more errors in the data retrieved from the one or more memory cells 205, correct one or more errors in the data retrieved from the one or more memory cells 205, or both based on the comparison of the codewords. The ECC block 265 may output the data from the one or more memory cells 205 (e.g., as output 255) to the local memory controller 260. The data may be a corrected version of the data retrieved from the one or more memory cells 205 or may include an indication of a detected error. The local memory controller 260 may transmit the data to the host device (e.g., after the ECC block 265 performs the error detection operations as part of the read operation), or cause the retrieved data to be transmitted after performing the error detection operations as part of the read operation. In some cases, the local memory controller 260 may include the ECC block 265 as described herein.

In some cases, the local memory controller 260 or the ECC block 265 may communicate any stored error detection information (e.g., an indication of a double-bit error detected by an ECC operation performed prior to storing the data) to a host device. In such cases, the memory die 200 may retrieve the associated error detection information when the data is retrieved as part of the read operation. The memory die 200 may transmit the error detection information to the host device as part of the read operation. In some other cases, the local memory controller 260 may retrieve a stored ECC codeword (e.g., an SEC codeword or a SECDED codeword) associated with the data. The local memory controller 260 may perform an ECC operation on the data to generate a new ECC codeword and compare the two ECC codewords (e.g., the stored ECC codeword and the generated ECC codeword) to detect and/or correct certain errors.

In some memory architectures, accessing the memory cell 205 may degrade or destroy the logic state stored in a memory cell 205 (e.g., for write operations or read operations). For example, a read operation performed in DRAM architectures may partially or completely discharge the capacitor of the target memory cell. The local memory controller 260 may perform a re-write operation or a refresh operation to return the memory cell to its original logic state. The local memory controller 260 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

Figure 3:
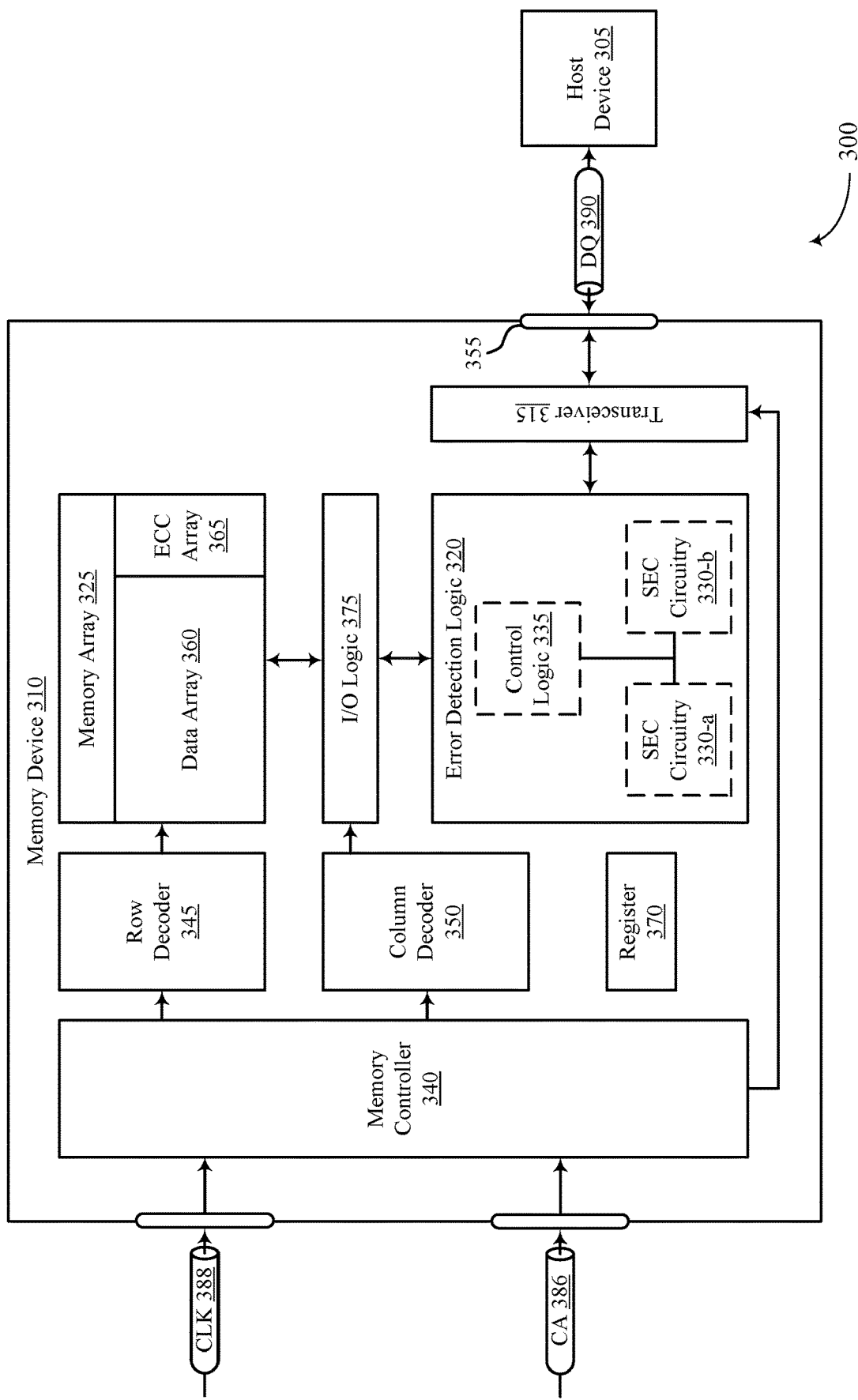
FIG. 3 illustrates an example of a system that supports configurable error correction modes as disclosed herein.

FIG. 3 illustrates an example of a system 300 that illustrates a memory device with configurable error correction modes as disclosed herein. The system 300 may include one or more components as described with reference to FIGS. 1 and 2. The system 300 may include a host device 305 and a memory device 310 coupled together using a plurality of channels (e.g., C/A channel 386, CLK channel 388, data channel 390, an error detection channel, other channels, or a combination thereof). The host device 305 may be an example of the external memory controller 105 as described with reference to FIG. 1; the memory device 310 may be an example of memory device 110 and/or the memory die 200 described with reference to FIGS. 1 and 2; the C/A channel 386, the CLK channel 388, and the data channel 390 may be examples of C/A channel 186, the CLK channel 188, and the data channel 190 respectively as described with reference to FIG. 1; the memory array 325 may be an example of one or more of the memory arrays 170 as described with reference to FIG. 1; the memory controller 340 may be an example of the device memory controller 155 or local memory controllers 165 or 260 as described with reference to FIGS. 1 and 2; the row decoder 345 may be an example of the row decoder 220 described with reference to FIG. 2; the column decoder 350 may be an example of the column decoder 225 described with reference to FIG. 2; and error detection logic 320 may include independent components, aspects of the device memory controller 155 or local memory controllers 165 or 260 as described with reference to FIGS. 1 and 2, or a combination thereof. The memory device 310 may also include a transceiver 315 for communicated data with the host device 305 over the data channels 390. In some cases, the transceiver 315 may include one or more I/O buffers.

The host device 305 may transmit data over the data channel 390 as part of a write operation. The data may be sent over a quantity of pins 355 making up the data channel 390 for a certain burst length (e.g., a quantity of unit intervals). The memory device 310 may store the data in the memory array 325 as part of the write operation. In some cases, the data stored in the memory array 325 may become corrupted. The memory device 310 may be configured to perform one or more error detection and/or error correction operations on data stored in the memory array 325. Errors introduced into the data may cause processes being performed by the host device 305 and/or memory device 310 to fail or have problems. Error detection information may be used in some circumstances to detect and/or correct some of these errors.

The memory controller 340 may determine which type of error correction procedure is enabled (e.g., SEC or SECDED), if programmable. In some cases, the memory controller 340 may identify the type of error correction procedure based on an indication received from the host device 305. For example, the host device 305 may cause a value in a register 370 (e.g., a mode register) to be set to indicate the type of error correction procedure (e.g., the host device 305 may set the register 370 to a logic value '0' to indicate SEC and a logic value '1' to indicate SECDED). In some other examples, the host device 305 may transmit an indication to the memory device 310 (e.g., over a CA channel 386). In some other cases, the memory device 310 may be hardwired to perform SECDED for certain options.

As part of a write operation, the memory device 310 may receive data from the host device 305 over one or more data channels 390. In some cases, the memory device 310 may include a quantity of pins for coupling with the data channels 390. The transceiver 315 may receive and/or buffer the data from the host device 305. The error detection logic 320 may determine or generate one or more error detection codewords associated with the data received from the host device 305 as part of the write operation. The error detection logic 320 may configured to perform SEC operations on the received data or SECDED operations on the received data based on the mode in which the memory device 310 is operating. After performing one or more ECC operations, the data received from the host device 305 and the ECC codewords generated or determined by the error detection logic 320 may be passed to the I/O logic 375 and stored in the memory array 325. In some cases, the data may be stored in a first portion of the memory array (e.g., the data array 360) and the ECC codewords may be stored in a second portion of the memory array (e.g., the ECC array 365).

The memory device 310 may be capable of performing different types of error detection operations based on the mode of operation of the memory device 310. For example, in a first mode the memory device 310 may perform at least one SEC operation on data received from the host device 305. In a second mode, the memory device may perform at least one SECDED operation on data received from the host device 305.

The circuitry and/or the ECC array storage for performing SEC operations and SECDED operations may differ. For example, the memory system may allocate a portion of a memory die to circuitry and/or storage for the error detection operations. In some traditional systems, the circuitry for configuring a memory die to perform SECDED may be more extensive than the circuitry for configuring a memory die to perform SEC. Additionally or alternatively, in some traditional systems, the ECC array allocation for SECDED may be more extensive than the ECC array allocation for SEC. In some cases, the additional circuitry for performing SECDED may relate to an increased ECC codeword size for SECDED when compared to SEC. For example, a memory system configured with SEC may use two 8-bit ECC codewords in order to perform an error detection operation for two 128 bits of data while a memory system configured with SECDED may use two 9-bit ECC codewords to perform an error detection operation for two 128 bits of data. The increased ECC codeword size may result in a wider internal ECC channel. For example, a memory die configured to perform SEC may use a first ECC channel width while a memory die configured to perform SECDED may use an increased ECC channel width. The increased codeword size may also use more memory cells of the memory array 325 to store the data and the ECC codewords. This may lead to an increased portion of the memory die being allocated for ECC circuitry and the storage of ECC information (e.g., from 6.3% for SEC to 12.6% for SECDED). For example, the memory device 310 may utilize a single internal data path for ECC array storage for the ECC to receive two 8-bit SEC ECC codewords during the same interval as receiving two 128 bits of data across 16 data pins making up the DQ channel 390. However, the memory device 310 may use two internal data paths for ECC array storage for the ECC to receive two 9-bit SECDED ECC codewords during the same interval as receiving two 128-bits of data across the 16 data pins making up the DQ channel 390. In some cases, a memory system may not support the increased circuitry demands for enabling SECDED (e.g., when compared to SEC). For example, a commodity LP5 DRAM market may not support additional die size increase. In addition, larger ECC codewords may use more memory to store. For example, the memory array 325 may be divided into a first portion that stores data (e.g., data array 360) and a second portion that stores error detection information (e.g., ECC array 365). When the size of the ECC codeword gets bigger the size of the memory array and support circuitry may increase by 6.3% or 12.6%.

Here, the memory device 310 may use SEC circuitry for both SEC operations and SECDED operations. When performing an SEC operation, control logic 335 of the error detection logic 320 may configure the functionality of the circuitry (e.g., SEC circuitry 330) within the error detection logic 320 according to the indicated type of error correction procedure. The error detection logic 320 may cause the burst of information to be divided into one or more portions of data and corresponding codewords to be determined for each portion of data. The error detection logic 320 may perform the error detection operation on the portions of data using the corresponding ECC codewords. For example, the data channel 390 includes 16 data pins and the host device 305 uses a burst length of 16 which may generate a 256-bit burst of data. The error detection logic may divide the burst of data into two 128-bit portions and may determine two corresponding SEC codewords (e.g., 2 8-bit codewords) for each portion of data. The control logic 335 may configure the SEC circuitry 330 such that the SEC circuitry 330-a performs an SEC operation on the first portion of data (e.g., using the first SEC codeword) while the SEC circuitry 330-b performs an SEC operation on the second portion of data (e.g., using the second SEC codeword). Here, the error detection logic 320 may detect and correct single-bit errors. In some cases (e.g., in the event of a double-bit error), the error detection logic 320 may inadvertently flip a bit that was correct, thus creating an additional bit-error. The updated (e.g., corrected or inadvertently incorrected) data may be stored at the memory array 325.

When performing an SECDED operation, the control logic 335 may configure the functionality of the circuitry (e.g., SEC circuitry 330) within the error detection logic 320 according to the indicated type of error correction procedure. For example, the control logic 335 may configure the first SEC circuitry 330-a and the second SEC circuitry 330-b to act as a single set of SECDED circuitry.

The error detection logic 320 may perform the SECDED operation on the burst of information with less granularity than an SEC operation, in some cases. For example, when the data channel 390 includes 16 data pins and the host device 305 uses a burst length of 16 to generate a 256-bit burst of data, the error correction information may be a SECDED codeword (e.g., of length 10 bits), the error detection logic 320 may perform one SECDED operation on the 256-bit burst of data using the SECDED codeword. Here, the control logic 335 may configure the SEC circuitry 330 such that the SEC circuitry 330-a and SEC circuitry 330-b together perform an SECDED ECC operation on the burst of data received from the host device 305. The error detection logic 320 may detect and correct single-bit errors and detect double-bit errors. In some cases, the error detection information may contain parity bits in addition to the SECDED codeword. In some cases, the additional parity bits may provide for a greater level of double-bit error detection (e.g., a more precise location of error detection). In some other cases, the additional parity bits may allow the error detection logic to correct double-bit errors as well. The updated (e.g., corrected or updated) data may be stored at the memory array 325. In some cases, an indication of a double-bit error (e.g., that may not be corrected) may also be stored at the memory array 325. Additionally or alternatively, the double-bit error may be indicated to the host device 305 over the transceiver 315.

As part of the read operation, the memory device 310 may be configured to perform one or more error detection operations on the data retrieved from the memory array 325 using one or more error detection codewords retrieved from the memory array 325. The error detection operations may be configured to correct or detect errors in the data stored in the memory array 325.

Upon retrieving the data from the data array 360 as part of the read operation, the memory device 310 may also retrieve the one or more error detection codewords from the ECC array 365. The error detection logic 320 may generate additional error detection codewords based on the data retrieved from the data array 360. The error detection logic 320 may compare the error detection codewords retrieved from the ECC array 365 to the additional error detection codewords generated or determined based on the data retrieved from the data array 360. The error detection logic 320 may detect one or more errors in the retrieved data, correct one or more errors in the retrieved data, or both based on the comparison of the codewords. The memory device 310 may transmit the retrieved data to the host device 305 after performing the error detection operations as part of the read operation, or cause the retrieved data to be transmitted after performing the error detection operations over the data channel 390. In some cases, the functions of the error detection logic 320 may at least partially be performed by the memory controller 340. In some cases, the memory controller 340 may include one or more control registers or one or more redundancy fuses and logic or a combination thereof.

In some cases, the techniques described above with reference to internal error detection operations for data stored on the memory array 325 may be applied to any information communicated between the host device 305 and the memory device 310 (e.g., data communicated over the data channel 390, command/address information communicated over the C/A channel 386, etc.). Data communicated between the host device 305 and the memory device 310 may be corrupted in transit. The host device 305 may transmit error detection information over an error detection channel, which may allow the memory device 310 to perform an on-die error correction and/or detection. The error detection channel may include a single pin such that the quantity of bits transmitted within the error detection information may be less than or equal to a burst length of the data. In some cases, the error detection channel may include a plurality of pins (e.g., two pins, three pins, four pins, five pins, etc.).

Prior to transmitting the error detection information, the host device 305 may generate the error detection information (e.g., a codeword) based on the data and a mode of error detection for the memory system 300. That is, the memory device 310 may have a capability to utilize more than one type of ECC (e.g., either SEC or SECDED) to detect and/or correct errors within the data. For example, the ECC codeword may include parity bits for SEC ECC if the memory system is operating according to a mode for performing SEC. In another example, the codeword may include parity bits for SECDED ECC if the memory device 310 is operating according to a mode for performing SECDED. In some cases, the error detection information may further include one or more parity bits associated with a corresponding portion of the data. For example, the error detection information may include four additional parity bits, where each parity bit corresponds to a distinct quarter of the data. In some cases, this may allow the memory device 310 to detect and/or correct additional errors within the received data.

The host device 305 may communicate with the memory device 310 the mode of error detection to be used for the data. To ensure that error detection and operation works properly both the host device 305 and the memory device 310 may be configured to coordinate which modes they are using. For example, the host device 305 may send a burst of information to the memory device 301 over the transceiver 315. The burst of information may include data and, in some cases, error detection information. The size of the burst of information may correspond to a quantity of pins making up the DQ channel 390 and the ECC channel as well as the burst length. The transceiver 315 may relay the received burst of information (e.g., containing data and error detection information) to the error detection logic 320. Using either the SEC or the SECDED mode for ECC, the error detection logic 320 may detect and/or correct one or more errors (e.g., using the control logic 335 and one or more of the SEC circuitry 330) associated with data based on the error detection information.

In some cases, a standard LP DRAM may be a ×16 (16 I/Os) and clocks data in to DRAM or out of DRAM at a burst length of 16 and the array may be constructed as two 128-bit ×8 subarrays. Thus, a ×16 device may have an upper byte and lower byte; the die may also have an option to make the design a byte mode device and made available as ×8 (8 I/Os) and clock data in to DRAM or out of DRAM at a burst length of 16 and the array may be constructed as one 128-bit ×8 subarray so a ×8 device has one byte. For some ×16 LP DRAM, there may be 16 I/Os to transmit data between DRAM and SoC and for the standard ×8 LP DRAM, there are 8 I/Os to transmit data between DRAM and SoC.

Some LP DRAMs may have internal on-die ECC. That is, the ECC data generation and checking may be performed entirely within the LPDRAM; the internal ECC function may be obscured or invisible to the SoC or host device. The internal on-die ECC may be constructed with the array as two 128+8 with 8 I/Os. For example, the internal on-die ECC may be configured to handle two portions that 128 bits of array data (e.g., data codeword) and one or more 8 bits segments of ECC data (e.g., ECC codeword or error detection information). The ×16 LPDRAM internal on-die ECC may be SEC ECC with two 128+8, 128 array data plus 8 ECC data making a full 256 array data plus 16 ECC data. The byte mode LPDRAM internal on-die ECC may be SEC ECC with one 128+8, 128 array data plus 8 ECC data. On a ×16, both portions of 128 bit array data is transferred from SoC over 16 DQs for a total of 256 bit array data. Once the LPDRAM captures the 256 bit array data (two 128 bit arrays) and transfers it internally, the internal on-die ECC may generate internal SEC ECC 8 bits of ECC data for each 128 bits of array data. The internal 16 bit ECC data may be transferred internally over an additional pseudo internal DQ. That is for a ×16 LPDRAM, 16 unit intervals (ui) may transfer 256 bit of array data over 16 DQs in to the memory array of LPDRAM. The 16 bit ECC internally generated data may also be transferred to an additional section of the memory array for storage. When data is read from the LPDRAM, the array data and ECC data may be compared internally, correcting any single bit error prior to reading out the array data to the SoC or host device. The internally generated ECC data may not transferred to the SoC or host device, in some cases.

When LPDRAM is used in automobiles or other vehicles (e.g., motorcycles, buses, trucks, planes, trains, etc.), some users may like SECDED on-die ECC instead of SEC on-die ECC, if possible. In order to change SEC to SECDED in LPDRAMs, it may require the array to change to 256+18 to support two sub arrays of 128+9 instead of 128+8. Since the burst length is 16 unit intervals, the internal bussing and storage for the ECC data may use one additional pseudo internal DQ paths and storage, which may lead to a significant addition to die size.

If SECDED on-die ECC is supported on the ×16 and not the ×8 LPDRAM, the two 128+9 subarray support may not be needed. SECDED may be supported on a single 256 bit array with only 10 bits of error detection information. Such configurations would mean that there may be no (or very minimal) die size increase because the DRAM may support up to 16 error bits. Thus, the die may be designed to be a standard byte mode device with SEC on-die ECC or a ×16 device with the option to selectively be either SECDED or SEC for on-die ECC coverage.

Figure 4:
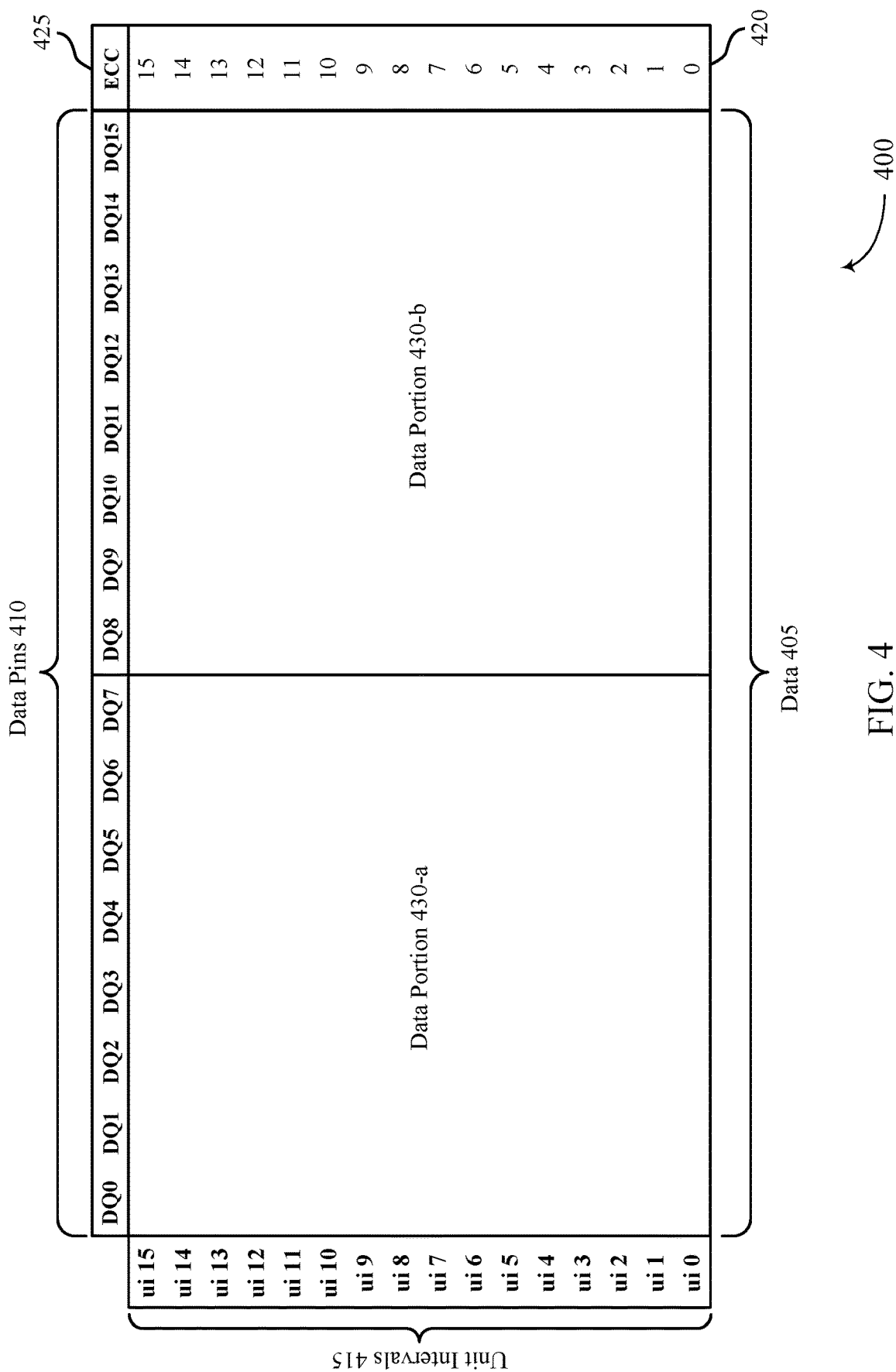
FIG. 4 illustrates an example of a burst of information that supports configurable error correction modes as disclosed herein.

FIG. 4 illustrates an example of a burst of information 400 that supports configurable error correction modes as disclosed herein. The burst of information may include data 405 and error detection information 420. Portions of the burst of information may be generated and transmitted by a host device as described with reference to FIGS. 1 through 3. Other portions of the burst of information 400 may be generated by a memory device (e.g., error detection information 420). The data 405 may be received and stored at a memory device, which may be an example of the memory device 110, the memory die 160, the memory die 200, or the memory device 310 as described with reference to FIGS. 1 through 3. The memory device may use the error detection information 420 to detect and/or correct some errors within the data 405 after the data has been stored in a memory array (e.g., as described with reference to FIGS. 1 through 3).

The burst of data may include data 405, which may be an example of a burst of data communicated over a data channel (e.g., DQ channels 190, 390). The data 405 may be divided into portions, for example data portions 430-a and 430-b. The data channel may have a quantity of data pins 410 that define the width of the channel. For example, the data channel may be 16 pins wide (e.g., DQ01 through DQ15). In other examples, the data channel may be less than sixteen pins wide or more than sixteen pins wide. The burst of data may also have a plurality of unit intervals 415, or time resources for communicating at least one symbol (e.g., bit) of data. In systems that use double-data rates, a unit intervals 415 may occur at every clock edge, both rising and falling. In other systems that use single data rates, a unit interval 415 may occur every clock cycle.

In some cases, the burst of information may include portions of error detection information 420. In some cases, the error detection information 420 is generated internally at the memory device and used internally at the memory device. In other cases, the error detection information 420 is generated by the host device and transmitted by the host device to the memory device. In some of these cases, the error detection channel may have a single error detection pin 425 that defines the width of the error detection channel. In some cases, the quantity of bits contained within the error detection information 420 may be less than or equal to the quantity of unit intervals 415. The error detection information 420 may include one or more codewords (e.g., an SEC codeword, an SECDED codeword) and, in some cases, additional parity bits related to the data 405. The type of codeword or codewords contained in the error detection information 420 may correspond to the mode of operation of the memory device or the type of error detection operation being employed by the memory systems. That is, the memory system may be capable of operation according to an SEC mode or an SECDED mode (e.g., as indicated by the host device). The error detection information 420 and the data 405 may be apportioned based on the type of error detection operation being used by the memory system.

When the memory system is operating according to an SEC mode, the burst of information 400 may be divided into one or more data portions 430. The burst of information 400 may include error detection information 420 corresponding to each data portion 430. In some cases, the burst of information 400 may be divided into portions according to the unit intervals 415. For example, a first quantity of the unit intervals 415 may include the first data portion 430-a and the first codeword (e.g., contained within the first 8 bits of the error detection information 420). The data 405 may be divided into two 128-bit data portions 430 while the error detection information 420 may be divided into two corresponding 8-bit codewords. That is, the data portion 430-a may correspond to a first codeword transmitted within the same first 8 unit intervals over the error detection pin 425. Further, the data portion 430-b may correspond to a second codeword transmitted within the last 8 unit intervals. In this example, the burst of information 400 may include two distinct 128-bit data portions and two corresponding 8-bit SEC codewords. In some cases, the data may be broken into any quantity of portions having any quantity of bits within each portion. Similarly, the error detection information 420 may include any quantity of codewords of any bit-size. The memory device may perform distinct SEC procedures on the subarrays to detect and correct single-bit errors in each portion. That is, the memory device may perform the SEC procedure on a portion-by-portion granularity.

When the memory system is operating according to an SECDED mode, the burst of information 400 may not be divided into data portions 430 (or may be divided into larger portions). The memory system may perform an SECDED operation on all of the data 405 (e.g., corresponding to data portions 430-a and 430-b) using the corresponding error detection information 420. That is, the error detection information 420 may correspond to all of the data 405. Here, the error detection information 420 may provide error detection information 420 for 256 bits of data. The error detection information 420 may include a single SECDED codeword. For example, the codeword may be a 10-bit SECDED codeword (e.g., transmitted within bits 0 through 9 of the error detection information 420) that allows the memory device to correct single-bit errors and detect double-bit errors. In some cases, the remaining bits within the error detection information 420 (e.g., bits 10, 11, 12, 13, 14, and 15) may be unused. Alternatively, one or more of the remaining bits within the error detection information 420 may include parity bits associated with a portion of the data 405. The additional parity bit or bits may allow the memory to device detect or correct double-bit or even more errors as well as identify error location in smaller boundary. For example, bits 10, 11, 12, and 13 may be used as parity bits for a distinct quarter of the data 405. Here, bit 10 may be a parity bit corresponding to the data 405 transmitted within the first four unit intervals 415 (e.g., ui0 through ui3), and bits 11 through 13 may be parity bits corresponding to the other three distinct portions of the data 405 (e.g., as defined by ui4 through ui7, ui8 through ui11, and ui12 through ui15). In another example, the bits 10 through 15 may provide additional parity bits on a per-nibble bases (e.g., per 4-bit basis).

Figure 5:
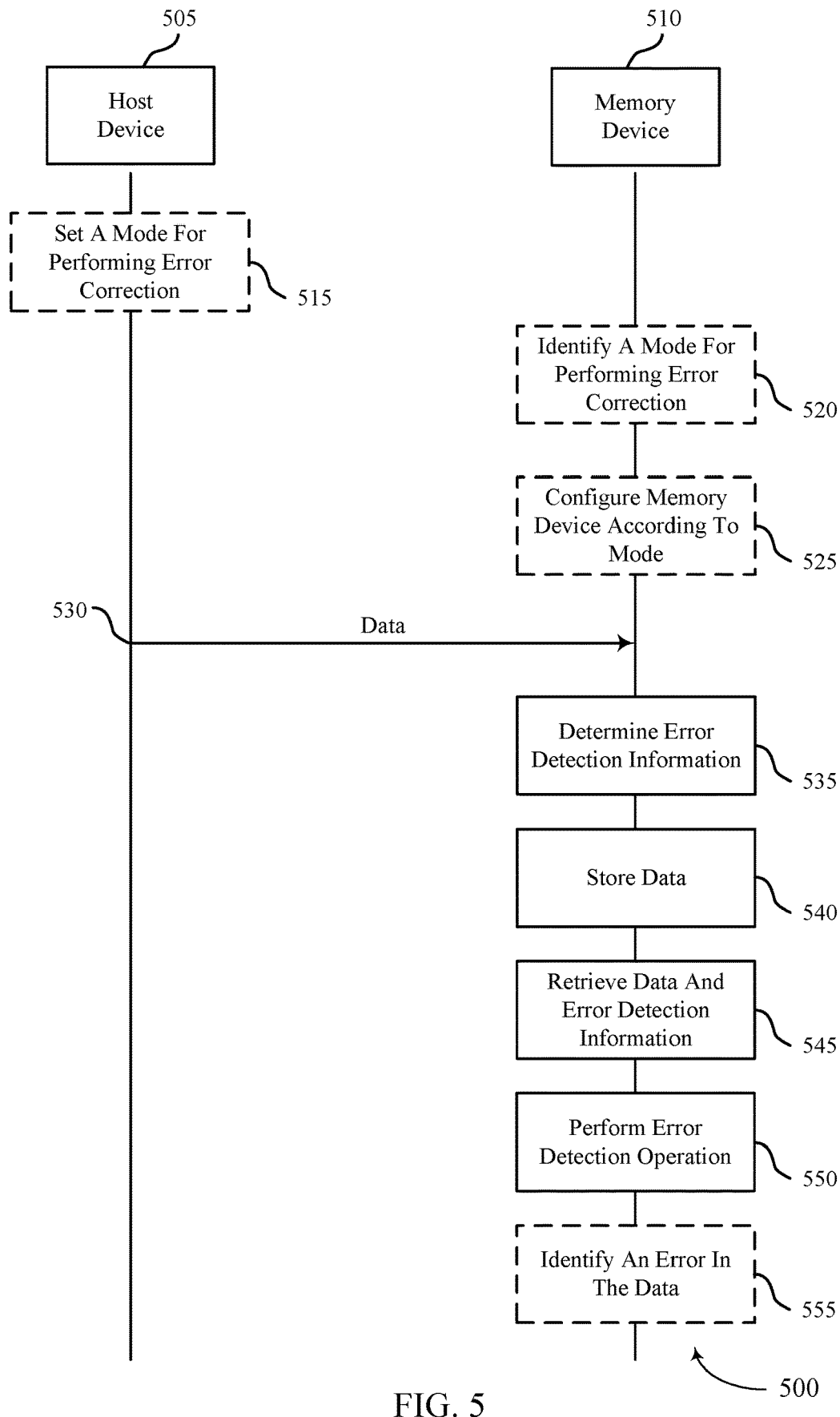
FIG. 5 illustrates an example of a process flow that supports configurable error correction modes as disclosed herein.

FIG. 5 illustrates an example of a process flow 500 that supports configurable error detection modes as disclosed herein. The process flow 500 may implement aspects of the systems 100 and 300 and memory die 200 described with reference to FIGS. 1 through 3. The process flow 500 may include operations performed by a host device 505, which may be an example of host device 305 as described with reference to FIG. 3. Host device 505 may implement aspects of the external memory controller 105 as described with reference to FIG. 1. The process flow 500 may further include operations performed by a memory device 510, which may be an example of the memory device 110, the memory array 170, or the memory die 200, or the memory device 310 as described with reference to FIGS. 1 through 3.

At 515, the host device 505 may optionally set a mode for performing error correction at the memory device 510. For example, the memory device 510 may be configured for performing error correction by performing an SEC operation (e.g., a first mode for performing error correction) or by performing an SECDED operation (e.g., a second mode for performing error correction). The host device 505 may set the mode for performing error correction at the memory device 510 by causing a value in a mode register (e.g., at the memory device 510) to be set to indicate the type of error correction procedure. For example, the host device 505 may set the mode register to a logic value '0' to indicate SEC and a logic value '1' to indicate SECDED. Additionally or alternatively, the host device 505 may transmit an indication to the memory device 510 indicating the mode for performing error correction. In some cases, the indicator received from the host device 505 may be stored in the mode register of the memory device 510.

At 520, the memory device 510 may optionally identify a mode for performing error correction. In some cases, the memory device 510 may identify the mode for performing error detection or correction based on a hard coded characteristic of the memory device 510. In some cases, the memory device 510 may identify the mode for performing error detection or correction by retrieving an indicator of the mode for operating the memory device from the mode register of the memory device 510. In some cases, the memory device 510 may receive an indicator from the host device 505 requesting that the memory device 510 operate in a different mode.

At 525, the memory device 510 may optionally configure the memory device 510 according to the mode (e.g., as identified at 520). That is, the memory device 510 may configure the memory device 510 for correcting errors (e.g., according to SECDED or SEC) in data received from the host device 505 based on identifying the mode for performing error correction. In some cases, the memory device 510 may switch from one mode (e.g., SEC) to another mode (e.g., SECDED) based on identifying the mode at 520. For example, the memory device 510 may switch based on receiving an indicator to switch modes from the host device 505.

Additionally or alternatively, the memory device 510 may be preconfigured to operate according to a certain mode for performing error correction. For example, a mode register may be hard set to a value indicating the mode for performing error correction at a factory. In another example, the memory device 510 may be hard coded (e.g., by masks or fuses) to operate according to the certain mode for performing error correction. Here, host device may not perform 515 and the memory device may not perform 520 or 525. Instead, the mode for performing error correction may be a preconfigured characteristic of the memory device 510.

At 530, the memory device 510 may receive data from the host device 505. The memory device 510 may receive data over a DQ channel (e.g., a first channel). The DQ channel may include sixteen conductive paths (e.g., pins).

At block 535, the memory device 510 may determine error detection information from the data received from the host device 505. That is, the memory device 510 may generate error detection information based on the data received from the host device 505 (e.g., by an internal ECC engine at the memory device 510). In some cases, the memory device 510 may include an ECC block (e.g., as discussed in reference to FIG. 2) that may generate the error detection information during a write operation (e.g., when the memory device 510 receives data from the host device 505 and writes the data to an array at the memory device 510). The error detection information may be examples of error detection codewords. When the memory device 510 is operating in a first mode (e.g., SEC mode), the error detection information may be one or more SEC codewords. When the memory device 510 is operating in a second mode (e.g., SECDED mode), the error detection information may be one or more SECDED codewords.

The error detection information may include a codeword according to the mode of operation. For example, if the memory device 510 is using an SECDED, the error detection information may include an SECDED codeword and one or more parity bits associated with portions of the data. Here, the SECDED codeword may include ten bits and may be associated with all of the data. In another example, if the memory device 510 is using an SEC, the error detection information may include a first codeword (e.g., a first SEC codeword) associated with a first portion of the data and a second codeword (e.g., a second SEC codeword) associated with a second portion of the data.

At 540, the memory device 510 may store the data received from the host device 505 and the error detection information (e.g., as generated by an internal ECC engine of the memory device 510 during a write operation) in an array of memory cells. The error detection information may be configured to detect or correct errors in the data when the data is retrieved from the array of memory cells as part of a read operation. In some cases, the data may include a corrected bit (e.g., corrected by SEC or SECDED). In some other cases, the data may include data where a double-bit error has been detected but not corrected.

At block 545, the memory device 510 may retrieve that data from the array of memory cells and may retrieve the error detection information from the array of memory cells. By storing the error detection information in the array of memory cells, the memory device 510 may be configured to detect and/or correct errors that may be been introduced into the data through the operations of writing the data to the memory array, storing the data in the memory array, refreshing the data in the memory array, reading the data from the memory array, other operations, or combinations thereof.

At 550, the memory device 510 may perform the error detection operation on the data retrieved from the memory array using the error detection information retrieved from the memory array. The memory device 510 may perform the error detection operation based on configuring the memory device 510 according to the identified mode. For example, the memory device 510 may perform an SECDED operation on the data using the error detection information based on the memory device 510 operating in the SECDED mode. The memory device 510 may generate new error detection information from the data retrieved from the array of memory cells, in some cases. The memory device 510 may compare the new error detection information with the error detection information retrieved from the memory array, in some cases. In other cases, the memory device 510 may perform the error detection operation 550 using the error detection information retrieved from the memory array, without generating new error detection information.

In some cases, the memory device 510 may identify an error in the data based on the error detection information at 555. For example, the memory device 510 may identify an error in the data based on an SECDED codeword included in the error detection information. In some cases, the memory device 510 may determine a portion of the data that includes the error based on a parity bit included in the error detection information. In some other cases, the memory device 510 may identify a single-bit error in the data using the error detection information and correct the single error in the data. Additionally or alternatively, the memory device 510 may identify a double-bit error in the data using the error detection information.

Figure 6:
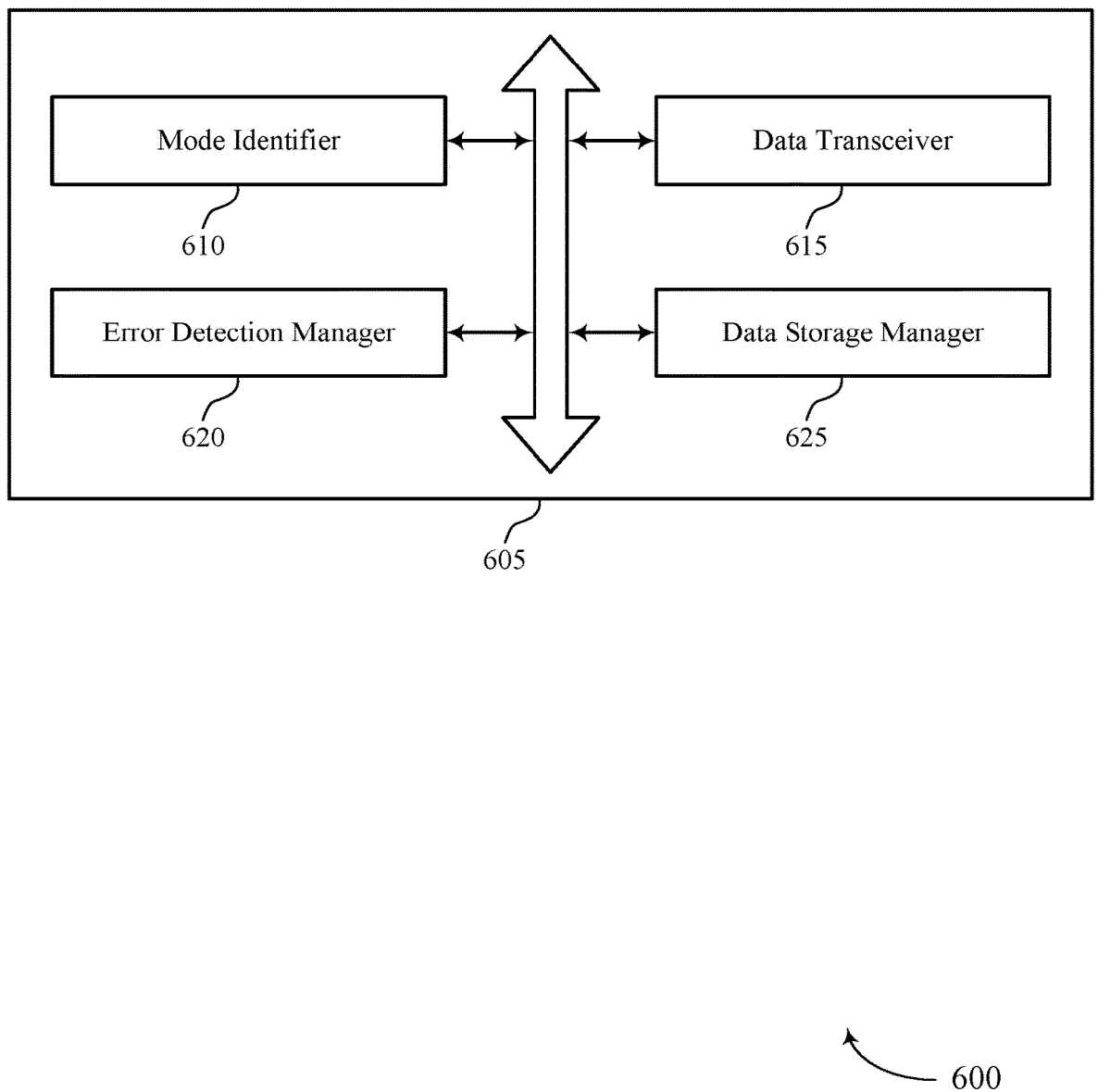
FIG. 6 shows a block diagram of a device that supports configurable error correction modes as disclosed herein.

FIG. 6 shows a block diagram 600 of a device 605 that supports configurable error correction modes as disclosed herein. The device 605 may be an example of aspects of memory device 110, memory device 310, and memory device 510 as disclosed herein with reference to FIGS. 1, 3, and 5. The device 605 may include a mode identifier 610, an data transceiver 615, an error detection manager 620, a data storage manager 625, an error detection manager 630, and a data storage manager 635. Each of these modules may communicate, directly or indirectly, with one another (e.g., via one or more buses).

The mode identifier 610 may identify that a memory device configured for operating in a first mode for performing at least one SEC operation and a second mode for performing a SECDED operation is operating in the second mode. The data transceiver 615 may receive, by the memory device operating in the second mode, data over a channel. The error detection manager 620 may determine, by the memory device based on receiving the data over the channel, error detection information associated with the data using the SECDED operation. The data storage manager 625 may store the data and the error detection information in an array of memory cells. In some examples, the data storage manager 625 may retrieve the data and the error detection information from the array of memory cells. In some examples, the error detection manager 620 may determine, by the memory device, a codeword (e.g., a SECDED codeword) associated with the data and one or more parity bits associated with portions of the data.

The mode identifier 610 may identify that a memory device is operating in a second mode for performing a SECDED operation, the memory device being configured for operating in the first mode for performing at least one SEC operation and a second mode. The data transceiver 615 may receive, by the memory device operating in the second mode, data over a data channel coupled with the memory device. The error detection manager 620 may perform the SECDED operation on the data retrieved from the array of memory cells using the error detection information retrieved from the array of memory cells based on the memory device operating in the second mode. That is, the error detection manager 620 may generate error detection information at the device 605 based on the data received over the channel. The data storage manager 625 may store the data, the SECDED codeword, and the one or more parity bits in an array of memory cells. In some examples, the data storage manager 625 may retrieve the data, the SECDED codeword, and the one or more parity bits from the array of memory cells, where the error detection operation is performed on the data retrieved from the array of memory cells using the SECDED codeword and the one or more parity bits retrieved from the array of memory cells. In some examples, the error detection manager 620 may perform an error detection operation on the data using the SECDED codeword and the one or more parity bits based on the memory device operating in the second mode.

In some examples, the mode identifier 610 may retrieve an indicator of a mode for operating the memory device from a mode register of the memory device, where identifying that that the memory device is operating in the second mode is based on retrieving the indicator from the mode register. In some cases, the mode identifier 610 may determine that the device 605 is preconfigured to operate according to a certain mode for performing error correction. For example, the mode register may be hard set to a value indicating the mode for performing error correction at a factory. In another example, the device 605 may be hard coded (e.g., by masks or fuses) to operate according to the certain mode for performing error correction.

In some examples, the mode identifier 610 may receive, from a host device, an indicator requesting that the memory device operate in the second mode. In some examples, the mode identifier 610 may switch from the first mode to the second mode based on receiving the indicator, where identifying that the memory device is operating in the second mode is based on switching from the first mode to the second mode. In some examples (e.g., in the example that the mode for operating the memory device is not hard coded at the memory device), the mode identifier 610 may receive, from a host device, an indicator requesting that the memory device operate in the second mode.

In some examples, the mode identifier 610 may switch from the second mode to the first mode based on receiving the indicator. In some cases, the error detection information determined by the memory device operating in the first mode includes a first codeword (e.g., a first SEC codeword) associated with a first portion of the data and a second codeword (e.g., a second SEC codeword) associated with a second portion of the data. In some cases, the channel has sixteen conductive paths.

In some examples, the error detection manager 620 may configure the memory device for correcting errors in the data received from a host device based on identifying that the memory device is operating in the second mode, where performing the SECDED operation is based on configuring the memory device.

In some examples, the error detection manager 620 may identify an error in the data retrieved from the array of memory cells based on the SECDED codeword included in the error detection information. In some examples, the error detection manager 620 may determine a portion the data that includes the error based on a parity bit included in the error detection information.

In some examples, the error detection manager 620 may identify a single-bit error in the data retrieved from the array of memory cells using the error detection information. In some examples, the error detection manager 620 may correct the single-bit error in the data.

In some examples, the error detection manager 620 may identify a double-bit error in the data retrieved from the array of memory cells using the error detection information. In some examples, the error detection manager 620 may transmit the data to another device with an indicator of the double-bit error but without correcting an error in the data. In some examples, the error detection manager 620 may identify an error in the data based on the SECDED codeword.

In some examples, the error detection manager 620 may determine a portion of the data that includes the error based on a parity bit of the one or more parity bits, where performing the error detection operation is based on determining the portion of the data that includes the error. In some cases, the error detection information determined by the memory device includes a codeword (e.g., a SECDED ECC codeword) and one or more parity bits associated with portions of the data. In some cases, the codeword includes ten-bits. In some instances, the codeword is an ECC codeword.

In some cases, a codeword (e.g., a SECDED codeword) included in the error detection information is associated with all the data. In some cases, a first parity bit of the one or more parity bits is associated with a first portion of the data. In some cases, a second parity bit of the one or more parity bits is associated with a second portion of the data. In some cases, the SECDED codeword includes ten bits. In some cases, the one or more parity bits include four bits.

The data storage manager 625 may store the error detection information associated with the data determined using the SECDED operation in an area of the array for storing error detection information associated with the data that is determined using an SEC operation.

Figure 7:
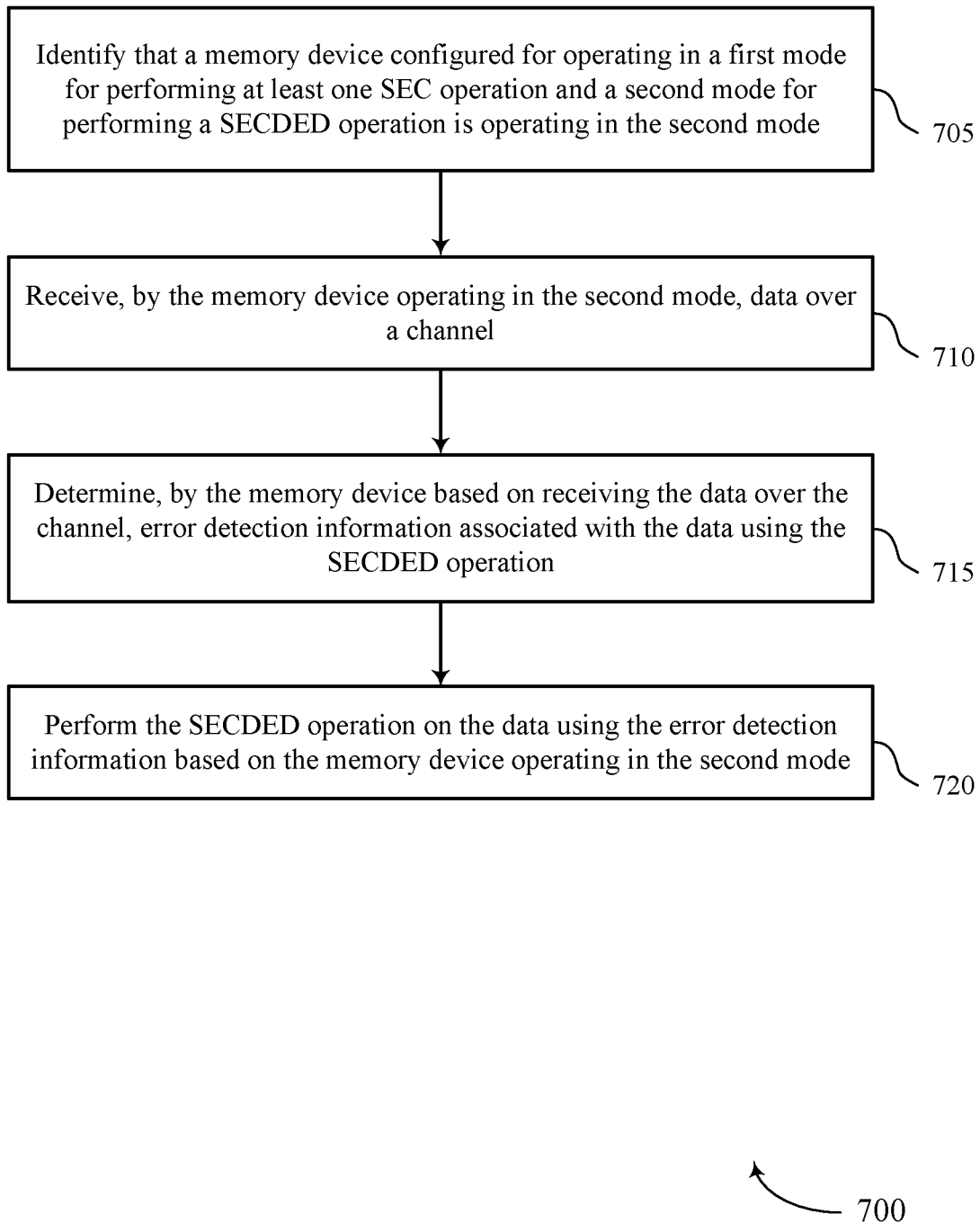
FIGS. 7 through 12 show flowcharts illustrating a method or methods that support configurable error correction modes as disclosed herein.

FIG. 7 shows a flowchart illustrating a method or methods 700 that supports memory device with configurable error correction modes in accordance with aspects of the present disclosure. The operations of method 700 may be implemented by a memory device (e.g., memory device 110, memory device 310, and memory device 510 as disclosed herein with reference to FIGS. 1, 3, and 5) or its components as described herein. For example, the operations of method 700 may be performed by a memory device as described with reference to FIG. 6. In some examples, a memory device may execute a set of instructions to control the functional elements of the memory device to perform the described functions. Additionally or alternatively, a memory device may perform aspects of the described functions using special-purpose hardware.

At 705, the memory device may identify that a memory device configured for operating in a first mode for performing at least one SEC operation and a second mode for performing a SECDED operation is operating in the second mode. The operations of 705 may be performed according to the methods described herein. In some examples, aspects of the operations of 705 may be performed by a mode identifier as described with reference to FIG. 6.

At 710, the memory device may receive, by the memory device operating in the second mode, data over a channel. In some cases, the memory device may transfer the data between an ECC block (e.g., as discussed with reference to FIG. 2) and an array by an internal channel. The operations of 710 may be performed according to the methods described herein. In some examples, aspects of the operations of 710 may be performed by a data transceiver as described with reference to FIG. 6.

At 715, the memory device may determine, by the memory device based on receiving the data over the channel, error detection information associated with the data using the SECDED operation. The operations of 715 may be performed according to the methods described herein. In some examples, aspects of the operations of 715 may be performed by an error detection manager as described with reference to FIG. 6.

At 720, the memory device may perform the SECDED operation on the data using the error detection information based on the memory device operating in the second mode. The operations of 720 may be performed according to the methods described herein. In some examples, aspects of the operations of 720 may be performed by an error detection manager as described with reference to FIG. 6.

Figure 8:
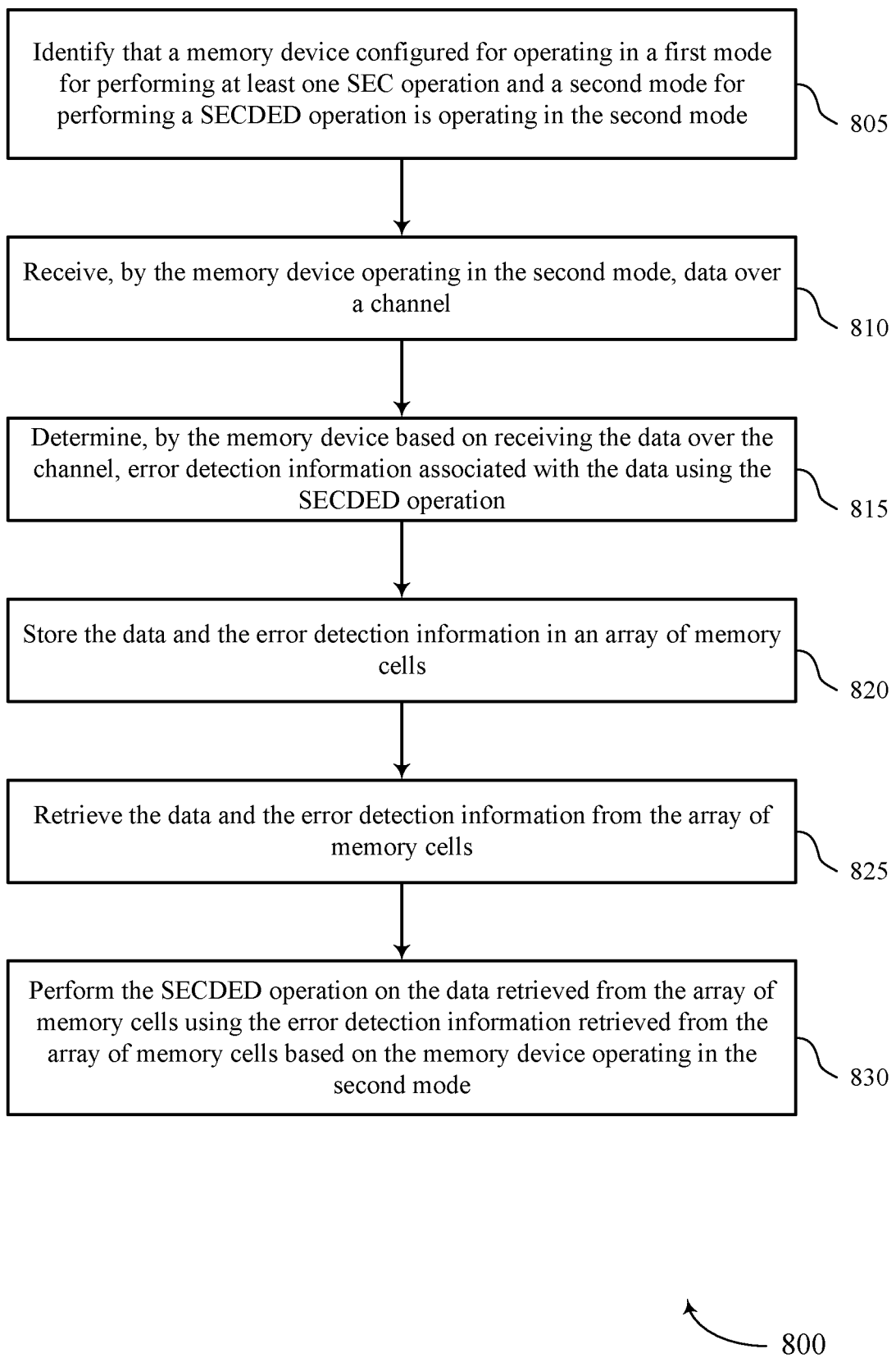

FIG. 8 flowchart illustrating a method or methods 800 that supports memory device with configurable error correction modes in accordance with aspects of the present disclosure. The operations of method 800 may be implemented by a memory device (e.g., memory device 110, memory device 310, and memory device 510 as disclosed herein with reference to FIGS. 1, 3, and 5) or its components as described herein. For example, the operations of method 800 may be performed by a memory device as described with reference to FIG. 6. In some examples, a memory device may execute a set of instructions to control the functional elements of the memory device to perform the described functions. Additionally or alternatively, a memory device may perform aspects of the described functions using special-purpose hardware.

At 805, the memory device may identify that a memory device configured for operating in a first mode for performing at least one SEC operation and a second mode for performing a SECDED operation is operating in the second mode. The operations of 805 may be performed according to the methods described herein. In some examples, aspects of the operations of 805 may be performed by a mode identifier as described with reference to FIG. 6.

At 810, the memory device may receive, by the memory device operating in the second mode, data over a channel. In some cases, the memory device may transfer the data between an ECC block (e.g., as discussed with reference to FIG. 2) and an array by an internal channel. The operations of 810 may be performed according to the methods described herein. In some examples, aspects of the operations of 810 may be performed by a data transceiver as described with reference to FIG. 6.

At 815, the memory device may determine, by the memory device based on receiving the data over the channel, error detection information associated with the data using the SECDED operation. The operations of 815 may be performed according to the methods described herein. In some examples, aspects of the operations of 815 may be performed by an error detection manager as described with reference to FIG. 6.

At 820, the memory device may store the data and the error detection information in an array of memory cells. The operations of 820 may be performed according to the methods described herein. In some examples, aspects of the operations of 820 may be performed by a data storage manager as described with reference to FIG. 6.

At 825, the memory device may retrieve the data and the error detection information from the array of memory cells. The operations of 825 may be performed according to the methods described herein. In some examples, aspects of the operations of 825 may be performed by a data storage manager as described with reference to FIG. 6.

At 830, the memory device may perform the SECDED operation on the data retrieved from the array of memory cells using the error detection information retrieved from the array of memory cells based on the memory device operating in the second mode. The operations of 830 may be performed according to the methods described herein. In some examples, aspects of the operations of 830 may be performed by an error detection manager as described with reference to FIG. 6.

In some examples, an apparatus as described herein may perform a method or methods, such as the method 800. The apparatus may include features, means, or instructions (e.g., a non-transitory computer-readable medium storing instructions executable by a processor) for identifying that a memory device configured for operating in a first mode for performing at least one SEC operation and a second mode for performing a SECDED operation is operating in the second mode, receiving, by the memory device operating in the second mode, data over a channel, determining, by the memory device based on receiving the data over the channel, error detection information associated with the data using the SECDED operation, storing the data and the error detection information in an array of memory cells, retrieving the data and the error detection information from the array of memory cells, and performing the SECDED operation on the data retrieved from the array of memory cells using the error detection information retrieved from the array of memory cells based on the memory device operating in the second mode.

Some examples of the method 800 and the apparatus described herein may further include operations, features, means, or instructions for configuring the memory device for correcting errors in the data received from a host device based on identifying that the memory device may be operating in the second mode, where performing the SECDED operation may be based on configuring the memory device.

Some examples of the method 800 and the apparatus described herein may further include operations, features, means, or instructions for retrieving an indicator of a mode for operating the memory device from a mode register of the memory device, where identifying that that the memory device may be operating in the second mode may be based on retrieving the indicator from the mode register.

In some examples of the method 800 and the apparatus described herein, the error detection information determined by the memory device includes a codeword (e.g., a SECDED codeword) and one or more parity bits associated with portions of the data.

Some examples of the method 800 and the apparatus described herein may further include operations, features, means, or instructions for identifying an error in the data retrieved from the array of memory cells based on the SECDED codeword included in the error detection information, and determining a portion the data that includes the error based on a parity bit included in the error detection information.

In some examples of the method 800 and the apparatus described herein, the SECDED codeword includes ten-bits.

In some instances of the method 800 and the apparatus described herein, the codeword is an ECC codeword.

In some examples of the method 800 and the apparatus described herein, performing the SECDED operation further may include operations, features, means, or instructions for identifying a single-bit error in the data retrieved from the array of memory cells using the error detection information, and correcting the single-bit error in the data.

In some examples of the method 800 and the apparatus described herein, performing the SECDED operation further may include operations, features, means, or instructions for identifying a double-bit error in the data retrieved from the array of memory cells using the error detection information, and transmitting the data to another device with an indicator of the double-bit error.

In some examples of the method 800 and the apparatus described herein, the channel may have sixteen conductive paths.

In some examples of the method 800 and the apparatus described herein, the error detection information determined by the memory device operating in the first mode includes a first codeword (e.g., a first SEC codeword) associated with a first portion of the data and a second codeword (e.g., a second SEC codeword) associated with a second portion of the data.

In some examples of the method 800 and the apparatus described herein, a codeword (e.g., a SECDED codeword) included in the error detection information may be associated with all the data.

Some examples of the method 800 and the apparatus described herein may further include operations, features, means, or instructions for receiving, from a host device, an indicator requesting that the memory device operate in the second mode, and switching from the first mode to the second mode based on receiving the indicator, where identifying that the memory device may be operating in the second mode may be based on switching from the first mode to the second mode.

In some cases of the method 800 and the apparatus described herein, the error detection information associated with the data using the SECDED operation is stored in an area of the area for storing error detection information associated with the data using an SEC operation.

Figure 9:
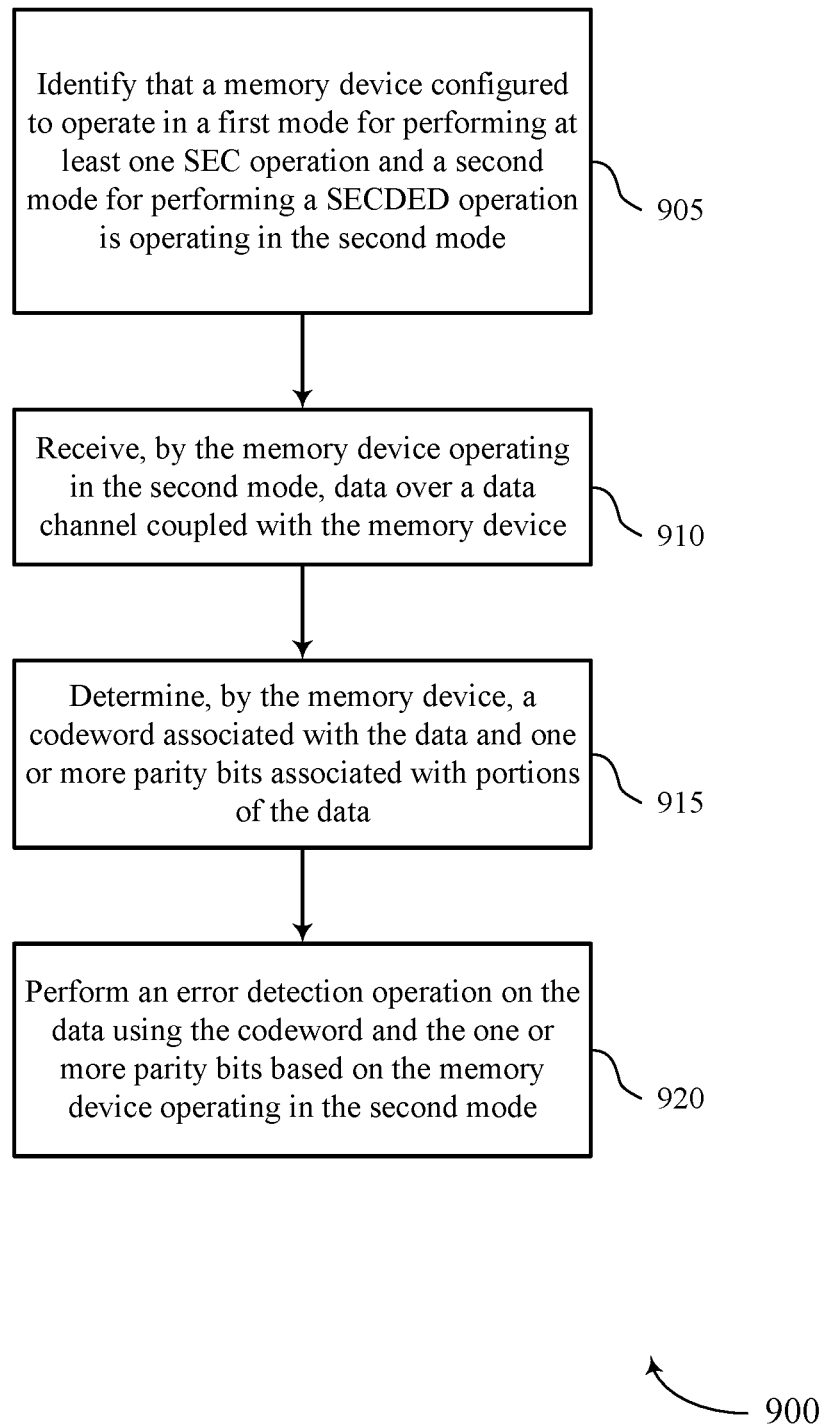

FIG. 9 shows a flowchart illustrating a method or methods 900 that supports memory device with configurable error correction modes in accordance with aspects of the present disclosure. The operations of method 900 may be implemented by a memory device (e.g., memory device 110, memory device 310, and memory device 510 as disclosed herein with reference to FIGS. 1, 3, and 5) or its components as described herein. For example, the operations of method 900 may be performed by a memory device as described with reference to FIG. 6. In some examples, a memory device may execute a set of instructions to control the functional elements of the memory device to perform the described functions. Additionally or alternatively, a memory device may perform aspects of the described functions using special-purpose hardware.

At 905, the memory device may identify that a memory device is configured to operate in a first mode for performing at least one SEC operation and a second mode for performing a SECDED operation is operating in the second mode. The operations of 905 may be performed according to the methods described herein. In some examples, aspects of the operations of 905 may be performed by a mode identifier as described with reference to FIG. 6.

At 910, the memory device may receive, by the memory device operating in the second mode, data over a data channel coupled with the memory device. The operations of 910 may be performed according to the methods described herein. In some examples, aspects of the operations of 910 may be performed by a data transceiver as described with reference to FIG. 6.

At 915, the memory device may determine, by the memory device, a codeword (e.g., a SECDED codeword) associated with the data and one or more parity bits associated with portions of the data. The operations of 915 may be performed according to the methods described herein. In some examples, aspects of the operations of 915 may be performed by an error detection manager as described with reference to FIG. 6.

At 920, the memory device may perform an error detection operation on the data using the SECDED codeword and the one or more parity bits based on the memory device operating in the second mode. The operations of 920 may be performed according to the methods described herein. In some examples, aspects of the operations of 920 may be performed by an error detection manager as described with reference to FIG. 6.

In some examples, an apparatus as described herein may perform a method or methods, such as the method 900. The apparatus may include features, means, or instructions (e.g., a non-transitory computer-readable medium storing instructions executable by a processor) for identifying that a memory device is configured to operate in a first mode for performing at least one SEC operation and a second mode for performing a SECDED operation is operating in the second mode, receiving, by the memory device operating in the second mode, data over a data channel coupled with the memory device, determining, by the memory device, a codeword (e.g., a SECDED codeword) associated with the data and one or more parity bits associated with portions of the data, and performing an error detection operation on the data using the SECDED codeword and the one or more parity bits based on the memory device operating in the second mode.

Some examples of the method 900 and the apparatus described herein may further include operations, features, means, or instructions for storing the data, the SECDED codeword, and the one or more parity bits in an array of memory cells, and retrieving the data, the SECDED codeword, and the one or more parity bits from the array of memory cells, where the error detection operation may be performed on the data retrieved from the array of memory cells using the SECDED codeword and the one or more parity bits retrieved from the array of memory cells.

Some examples of the method 900 and the apparatus described herein may further include operations, features, means, or instructions for identifying an error in the data based on the SECDED codeword, and determining a portion of the data that includes the error based on a parity bit of the one or more parity bits, where performing the error detection operation may be based on determining the portion of the data that includes the error.

In some examples of the method 900 and the apparatus described herein, a first parity bit of the one or more parity bits may be associated with a first portion of the data, and a second parity bit of the one or more parity bits may be associated with a second portion of the data.

In some examples of the method 900 and the apparatus described herein, the SECDED codeword includes ten bits, and the one or more parity bits include four bits, five bits, or six bits.

Figure 10:
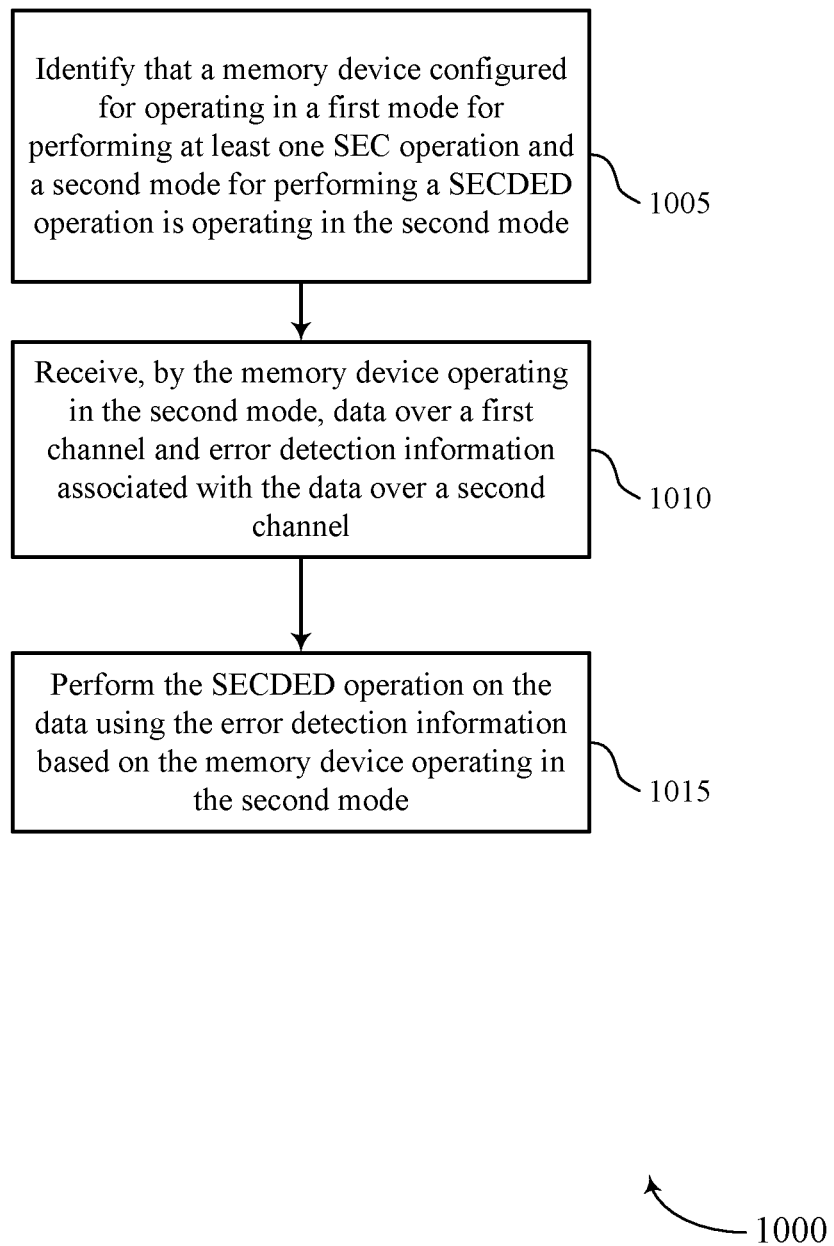

FIG. 10 shows a flowchart illustrating a method 1000 that supports configurable error correction modes as disclosed herein. The operations of method 1000 may be implemented by a memory device (e.g., memory device 110, memory device 310, and memory device 510 as disclosed herein with reference to FIGS. 1, 3, and 5) or its components as described herein. In some examples, a memory device may execute a set of instructions to control the functional elements of the memory device to perform the functions described herein. Additionally or alternatively, a memory device may perform aspects of the functions described herein using special-purpose hardware.

At 1005, the memory device may identify that a memory device configured for operating in a first mode for performing at least one SEC operation and a second mode for performing at least a SECDED operation is operating in the second mode. The operations of 1005 may be performed according to the methods described herein. In some examples, aspects of the operations of 1005 may be performed by a mode identifier as described with reference to FIG. 6.

At 1010, the memory device may receive, by the memory device operating in the second mode, data over a first channel and error detection information associated with the data over a second channel. The operations of 1010 may be performed according to the methods described herein. In some examples, aspects of the operations of 1010 may be performed by a data transceiver as described with reference to FIG. 6.

At 1015, the memory device may perform the SECDED operation on the data using the error detection information based on the memory device operating in the second mode. The operations of 1015 may be performed according to the methods described herein. In some examples, aspects of the operations of 1015 may be performed by an error detection manager as described with reference to FIG. 6.

Figure 11:
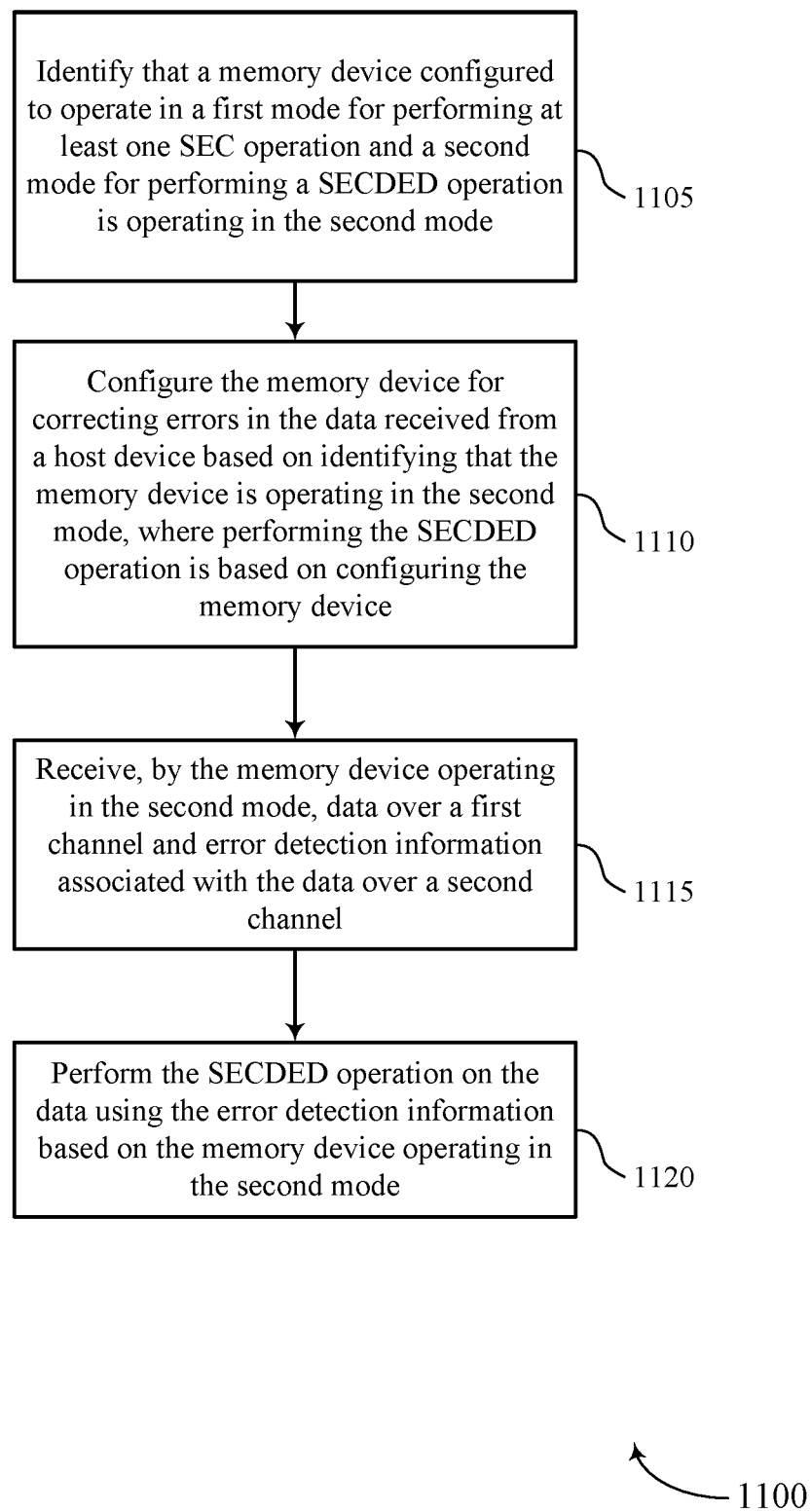

FIG. 11 shows a flowchart illustrating a method or methods 1100 that support configurable error correction modes as disclosed herein. The operations of method 1100 may be implemented by a memory device (e.g., memory device 110, memory device 310, and memory device 510 as disclosed herein with reference to FIGS. 1, 3, and 5) or its components as described herein. In some examples, a memory device may execute a set of instructions to control the functional elements of the memory device to perform the functions described herein. Additionally or alternatively, a memory device may perform aspects of the functions described herein using special-purpose hardware.

At 1105, the memory device may identify that a memory device configured for operating in a first mode for performing at least one SEC operation and a second mode for performing a SECDED operation is operating in the second mode. The operations of 1105 may be performed according to the methods described herein. In some examples, aspects of the operations of 1105 may be performed by a mode identifier as described with reference to FIG. 6.

At 1110, the memory device may configure the memory device for correcting errors in the data received from a host device based on identifying that the memory device is operating in the second mode, where performing the SECDED operation is based on configuring the memory device. The operations of 1110 may be performed according to the methods described herein. In some examples, aspects of the operations of 1110 may be performed by a mode identifier as described with reference to FIG. 6.

At 1115, the memory device may receive, by the memory device operating in the second mode, data over a first channel and error detection information associated with the data over a second channel. The operations of 1115 may be performed according to the methods described herein. In some examples, aspects of the operations of 1115 may be performed by a data transceiver as described with reference to FIG. 6.

At 1120, the memory device may perform the SECDED operation on the data using the error detection information based on the memory device operating in the second mode. The operations of 1120 may be performed according to the methods described herein. In some examples, aspects of the operations of 1120 may be performed by an error detection manager as described with reference to FIG. 6.

In some examples, an apparatus as described herein may perform a method or methods, such as the method 1100. The apparatus may include features, means, or instructions (e.g., a non-transitory computer-readable medium storing instructions executable by a processor) for identifying that a memory device configured for operating in a first mode for performing at least one SEC operation and a second mode for performing a SECDED operation is operating in the second mode, receiving, by the memory device operating in the second mode, data over a first channel and error detection information associated with the data over a second channel, and performing the SECDED operation on the data using the error detection information based on the memory device operating in the second mode.

Some examples of the method 1100 and the apparatus described herein may further include operations, features, means, or instructions for configuring the memory device for correcting errors in the data received from a host device based on identifying that the memory device may be operating in the second mode, where performing the SECDED operation may be based on configuring the memory device.

Some examples of the method 1100 and the apparatus described herein may further include operations, features, means, or instructions for retrieving an indicator of a mode for operating the memory device from a mode register of the memory device, where identifying that that the memory device may be operating in the second mode may be based on retrieving the indicator from the mode register.

In some examples of the method 1100 and the apparatus described herein, the error detection information received over the error detection channel includes a codeword (e.g., a SECDED codeword) and one or more parity bits associated with portions of the data.

Some examples of the method 1100 and the apparatus described herein may further include operations, features, means, or instructions for identifying an error in the data based on the SECDED codeword included in the error detection information, and determining a portion the data that includes the error based on a parity bit included in the error detection information.

In some examples of the method 1100 and the apparatus described herein, the SECDED codeword received in the error detection information includes ten-bits.

In some examples of the method 1100 and the apparatus described herein, performing the SECDED operation may include operations, features, means, or instructions for identifying a single-bit error in the data using the error detection information, and correcting the single error in the data.

In some examples of the method 1100 and the apparatus described herein, performing the SECDED operation may include operations, features, means, or instructions for identifying a double-bit error in the data using the error detection information, and storing the data in an array of memory cells of the memory device without correcting an error in the data.

Some examples of the method 1100 and the apparatus described herein may further include operations, features, means, or instructions for storing the data in an array of memory cells of the memory device based on performing the SECDED operation on the data using the error detection information.

In some examples of the method 1100 and the apparatus described herein, the first channel may have sixteen conductive paths. In some cases, the second channel may have a single conductive path.

In some examples of the method 1100 and the apparatus described herein, a second error detection information received over the error detection channel by the memory device operating in the first mode includes a first codeword (e.g., a first SEC codeword) associated with a first portion of the data and a second codeword (e.g., a second SEC codeword) associated with a second portion of the data.

In some examples of the method 1100 and the apparatus described herein, a codeword (e.g., a SECDED codeword) included in the error detection information may be associated with all the data.

Some examples of the method 1100 and the apparatus described herein may further include operations, features, means, or instructions for receiving, from a host device, an indicator requesting that the memory device operate in the second mode, and switching from the first mode to the second mode based on receiving the indicator, where identifying that the memory device may be operating in the second mode may be based on switching from the first mode to the second mode.

Figure 12:
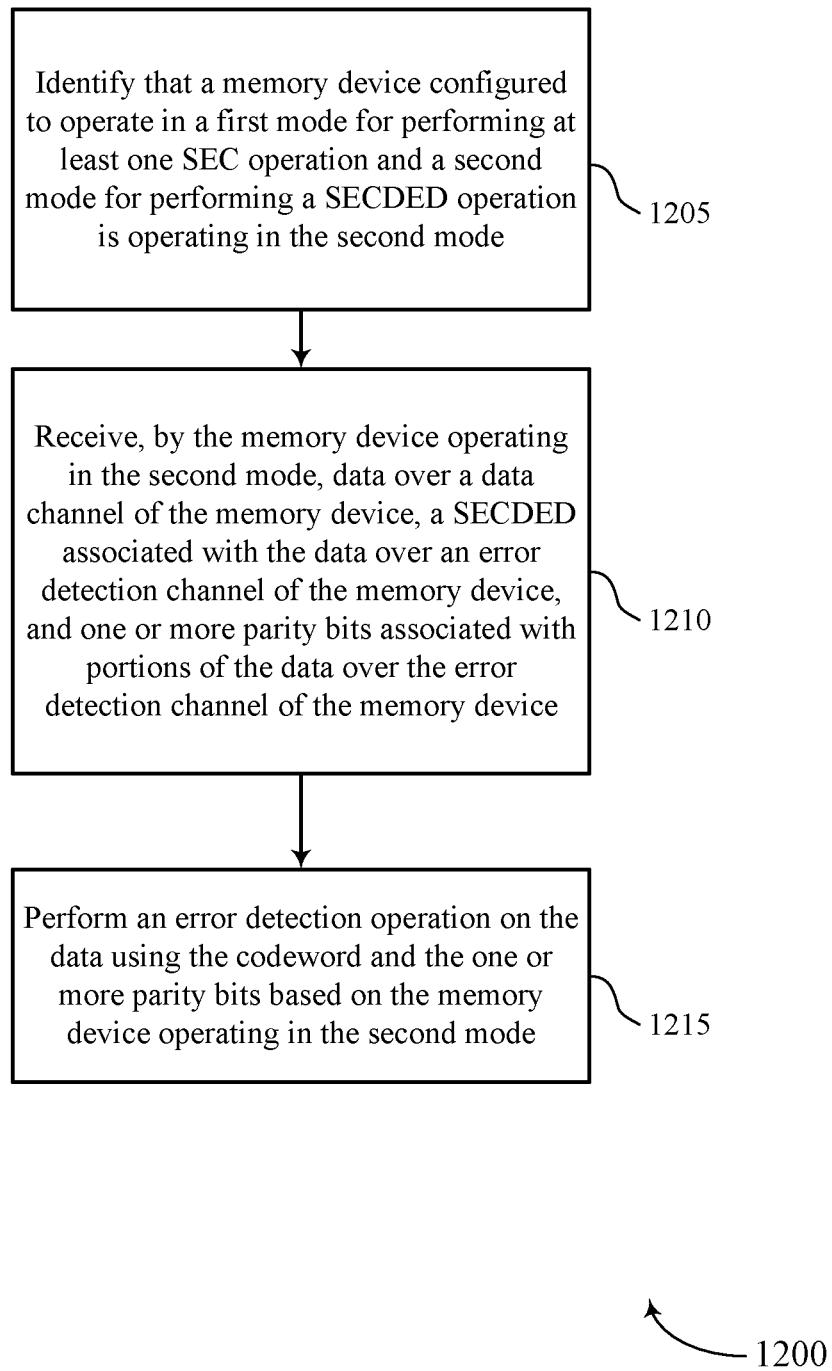

FIG. 12 shows a flowchart illustrating a method or methods 1200 that support configurable error correction modes as disclosed herein. The operations of method 1200 may be implemented by a memory device (e.g., memory device 110, memory device 310, and memory device 510 as disclosed herein with reference to FIGS. 1, 3, and 5) or its components as described herein. In some examples, a memory device may execute a set of instructions to control the functional elements of the memory device to perform the functions described herein. Additionally or alternatively, a memory device may perform aspects of the functions described herein using special-purpose hardware.

At 1205, the memory device may identify that a memory device configured to operate in a first mode for performing at least one SEC operation and a second mode for performing a SECDED operation is operating in the second mode. The operations of 1205 may be performed according to the methods described herein. In some examples, aspects of the operations of 1205 may be performed by a mode identifier as described with reference to FIG. 6.

At 1210, the memory device may receive, by the memory device operating in the second mode, data over a data channel of the memory device, a codeword (e.g., a SECDED ECC codeword) associated with the data over an error detection channel of the memory device, and one or more parity bits associated with portions of the data over the error detection channel of the memory device. The operations of 1210 may be performed according to the methods described herein. In some examples, aspects of the operations of 1210 may be performed by a data transceiver as described with reference to FIG. 6.

At 1215, the memory device may perform an error detection operation on the data using the SECDED codeword and the one or more parity bits based on the memory device operating in the second mode. The operations of 1215 may be performed according to the methods described herein. In some examples, aspects of the operations of 1215 may be performed by an error detection manager as described with reference to FIG. 6.

In some examples, an apparatus as described herein may perform a method or methods, such as the method 1200. The apparatus may include features, means, or instructions (e.g., a non-transitory computer-readable medium storing instructions executable by a processor) for identifying that a memory device is configured to operate in a first mode for performing at least one SEC operation and a second mode for performing a SECDED operation is operating in the second mode, receiving, by the memory device operating in the second mode, data over a data channel of the memory device, a codeword (e.g., a SECDED codeword) associated with the data over an error detection channel of the memory device, and one or more parity bits associated with portions of the data over the error detection channel of the memory device, and performing an error detection operation on the data using the SECDED codeword and the one or more parity bits based on the memory device operating in the second mode.

Some examples of the method 1200 and the apparatus described herein may further include operations, features, means, or instructions for identifying an error in the data based on the SECDED codeword, and determining a portion of the data that includes the error based on a parity bit of the one or more parity bits, where performing the error detection operation may be based on determining the portion of the data that includes the error.

In some examples of the method 1200 and the apparatus described herein, a first parity bit of the one or more parity bits may be associated with a first portion of the data, and a second parity bit of the one or more parity bits may be associated with a second portion of the data.

In some examples of the method 1200 and the apparatus described herein, the SECDED codeword includes ten bits, and the one or more parity bits include four bits.

It should be noted that the methods described above describe possible implementations, and that the operations and the steps may be rearranged or otherwise modified and that other implementations are possible. Furthermore, aspects from two or more of the methods may be combined.

In some examples, an apparatus with configurable error correction modes may perform aspects of the function described herein using general- or special-purpose hardware. The apparatus may include an array of memory cells that each comprise capacitive storage elements, a transceiver configured to communicate, with a host device, data over a data channel and error detection information over an error detection channel, and error detection logic coupled with the transceiver and configured to operate in a first mode for determining error detection information associated with the data using at least one SEC operation and configured to operate in a second mode for determining error detection information associated with the data using a SECDED operation.

In some cases, the error detection logic may be configured to perform the SECDED operation on the data received over the data channel when operating in the second mode, and the error detection logic may be configured to perform a first SEC operation on a first portion of the data received over the data channel and a second SEC operation on a second portion of the data when operating in the first mode.

In some cases, the error detection logic may control logic configured to identify that the error detection logic may be operating in the second mode and to configure the error detection logic based on the identifying.

In some instances, the apparatus may include a mode register configured to store an indicator of a mode for operating the error detection logic, where the error detection logic may be configured to operate in the second mode based on the indicator stored in the mode register.

In some examples, the error detection information received over the error detection channel or determined by the error detection logic includes a codeword (e.g., a SECDED codeword) and one or more parity bits associated with portions of the data.

In some cases, the error detection logic may be configured to identify a single-bit error in the data using the error detection information and correct the single error in the data.

In some instances, the error detection logic may be configured to identify a double-bit error in the data using the error detection information and store the data in the array of memory cells without correcting an error in the data, when operating in the second mode.

In some cases, the array of memory cells may be configured to store the data and the error detection information determined by the error detection logic, and the error detection logic may be configured to perform the SECDED operation on the data retrieved from the array of memory cells using the error detection information retrieved from the array of memory cells.

Although certain features may be described herein with respect to or in the context of DRAM technology, this is for illustrative purposes only, and one of ordinary skill in the art will appreciate that the teachings herein may be applied to any type of memory device. For example, the teachings herein may be applied to volatile or non-volatile memory devices such as magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    identifying that a memory device configured for operating in a first mode for performing at least one single error correction (SEC) operation and a second mode for performing a single error correction double error detection (SECDED) operation is operating in the second mode, wherein the memory device comprises a first portion of error correction circuitry and a second portion of error correction circuitry, and wherein operating in the first mode comprises operating the first portion and the second portion on different portions of a first set of data and operating in the second mode comprises operating the first portion and the second portion together on a same portion of a second set of data;
    receiving, by the memory device operating in the second mode, data over a channel, wherein the received data comprises the second set of data;

determining, by the memory device based at least in part on receiving the data over the channel, error detection information associated with the data using the SECDED operation;
storing the data and the error detection information in an array of memory cells;
retrieving the data and the error detection information from the array of memory cells; and
performing the SECDED operation on the data retrieved from the array of memory cells using the error detection information retrieved from the array of memory cells based at least in part on the memory device operating in the second mode.

2. The method of claim 1, further comprising:
configuring the memory device for correcting errors in the data received from a host device based at least in part on identifying that the memory device is operating in the second mode, wherein performing the SECDED operation is based at least in part on configuring the memory device.

3. The method of claim 1, further comprising:
retrieving an indicator of a mode for operating the memory device from a mode register of the memory device, wherein identifying that that the memory device is operating in the second mode is based at least in part on retrieving the indicator from the mode register.

4. The method of claim 1, wherein the error detection information determined by the memory device comprises a codeword and one or more parity bits associated with portions of the data.

5. The method of claim 4, further comprising:
identifying an error in the data retrieved from the array of memory cells based at least in part on the codeword included in the error detection information; and
determining a portion the data that includes the error based at least in part on a parity bit included in the error detection information.

6. The method of claim 1, wherein performing the SECDED operation further comprises:
identifying a single-bit error in the data retrieved from the array of memory cells using the error detection information; and
correcting the single-bit error in the data.

7. The method of claim 1, wherein performing the SECDED operation further comprises:
identifying a double-bit error in the data retrieved from the array of memory cells using the error detection information; and
transmitting the data to another device with an indicator of the double-bit error.

8. The method of claim 1, wherein the channel has sixteen conductive paths.

9. The method of claim 1, wherein the error detection information determined by the memory device operating in the second mode comprises a first codeword associated with a first portion of the data and a second codeword associated with a second portion of the data.

10. The method of claim 1, wherein a codeword included in the error detection information is associated with all the data.

11. The method of claim 1, further comprising:
receiving, from a host device, an indicator requesting that the memory device operate in the second mode; and
switching from the first mode to the second mode based at least in part on receiving the indicator, wherein identifying that the memory device is operating in the second mode is based at least in part on switching from the first mode to the second mode.

12. The method of claim 1, wherein the error detection information associated with the data determined using the SECDED operation is stored in an area of the array of memory cells for storing error detection information associated with the data that is determined using an SEC operation.

13. An apparatus, comprising:
an array of memory cells that each comprise capacitive storage elements;
a transceiver configured to communicate, with a host device, data over a data channel; and
error detection logic coupled with the transceiver and configured to operate in a first mode for determining error detection information associated with the data using at least one single error correction (SEC) operation and configured to operate in a second mode for determining error detection information associated with the data using a single error correction double error detection (SECDED) operation, wherein the error detection logic comprises a first portion of error correction logic and a second portion of error correction logic, and wherein operating in the first mode comprises operating the first portion and the second portion on different portions of a first set of data and operating in the second mode comprises operating the first portion and the second portion together on a same portion of a second set of data.

14. The apparatus of claim 13, wherein the error detection logic comprises:
control logic configured to identify that the error detection logic is operating in the second mode and to configure the error detection logic based at least in part on the identifying.

15. The apparatus of claim 13, further comprising:
a mode register configured to store an indicator of a mode for operating the error detection logic, wherein the error detection logic is configured to operate in the second mode based at least in part on the indicator stored in the mode register.

16. The apparatus of claim 13, wherein the error detection information determined by the error detection logic comprises a codeword and one or more parity bits associated with portions of the data.

17. The apparatus of claim 13, wherein the error detection logic is configured to identify a single-bit error in the data using the error detection information and correct the single-bit error in the data.

18. The apparatus of claim 13, wherein the error detection logic is configured to identify a double-bit error in the data using the error detection information and store the data in the array of memory cells without correcting an error in the data, when operating in the second mode.

19. The apparatus of claim 13, wherein:
the array of memory cells are configured to store the data and the error detection information determined by the error detection logic; and
the error detection logic is configured to perform the SECDED operation on the data retrieved from the array of memory cells using the error detection information retrieved from the array of memory cells.

20. A method, comprising:
identifying that a memory device configured to operate in a first mode for performing at least one single error correction (SEC) operation and a second mode for performing a single error correction double error detection (SECDED) operation is operating in the second mode, wherein the memory device comprises a first portion of error correction circuitry and a second portion of error correction circuitry, and wherein operating in the first mode comprises operating the first portion and the second portion on different portions of a first set of data and operating in the second mode comprises operating the first portion and the second portion together on a same portion of a second set of data;

receiving, by the memory device operating in the second mode, data over a data channel coupled with the memory device, wherein the received data comprises the second set of data;

determining, by the memory device, a codeword associated with the data and one or more parity bits associated with portions of the data; and performing an error detection operation on the data using the codeword and the one or more parity bits based at least in part on the memory device operating in the second mode.

21. The method of claim 20, further comprising:

storing the data, the codeword, and the one or more parity bits in an array of memory cells; and retrieving the data, the codeword, and the one or more parity bits from the array of memory cells, wherein the error detection operation is performed on the data retrieved from the array of memory cells using the codeword and the one or more parity bits retrieved from the array of memory cells.

22. The method of claim 20, further comprising:

identifying an error in the data based at least in part on the codeword; and determining a portion of the data that includes the error based at least in part on a parity bit of the one or more parity bits, wherein performing the error detection operation is based at least in part on determining the portion of the data that includes the error.

23. The method of claim 20, wherein:

a first parity bit of the one or more parity bits is associated with a first portion of the data; and a second parity bit of the one or more parity bits is associated with a second portion of the data.

24. The method of claim 20, wherein:

the codeword comprises ten bits; and the one or more parity bits comprise four bits, five bits, or six bits.

* * * * *